United States Patent
Ouchi et al.

[19]

[11] Patent Number: 6,055,251
[45] Date of Patent: Apr. 25, 2000

[54] METHOD AND APPARATUS FOR FREQUENCY MODULATING A SEMICONDUCTOR LASER, AND AN OPTICAL COMMUNICATION SYSTEM USING THE SAME

[75] Inventors: Toshihiko Ouchi, Machida; Masao Majima, Isehara, both of Japan

[73] Assignee: Canon Kabushiki Kaisha, Tokyo, Japan

[21] Appl. No.: 08/678,946

[22] Filed: Jul. 12, 1996

Related U.S. Application Data

[63] Continuation of application No. 08/573,209, Dec. 13, 1995, which is a continuation of application No. 08/306,613, Sep. 15, 1994.

[30] Foreign Application Priority Data

Sep. 17, 1993 [JP] Japan .................................. 5-231694
Oct. 7, 1993 [JP] Japan .................................. 5-251833

[51] Int. Cl.$^7$ ...................................................... H01S 3/10
[52] U.S. Cl. ............................... 372/28; 372/38; 372/32; 372/31; 372/26
[58] Field of Search .................................. 372/28, 38, 32, 372/31, 29, 26

[56] References Cited

U.S. PATENT DOCUMENTS

| | | | |
|---|---|---|---|
| 5,325,382 | 6/1994 | Emura et al. ............................. | 372/26 |
| 5,335,107 | 8/1994 | Georges et al. .......................... | 372/26 |

FOREIGN PATENT DOCUMENTS

| | | | |
|---|---|---|---|
| 0477987 | 4/1992 | European Pat. Off. ........ | H01S 3/103 |

OTHER PUBLICATIONS

Vernal Conference of Japan Applied Physics Society, 30a–SF–8, 1992, "FM Characteristics of 3–Electrode DFB Lasers With Nonuniform–Depth Grating" Hajime Shoji, et al. (Complete English translation) (No month).

NHK Science and Technical Research Laboratories, "LiNbO$_3$ Optical Wavelength Modulator For Bi–Directional Transmission in Optical CATV Subscriber Systems", OCS 91–82 1991, Ishikawa and Furata (English Translation of relevant parts—Sections 2 and 3.1, and Figs. 1 and 2) (No month).

Xing Pan et al, 'Modulation characteristics of tunable DFB/DBR lasers with one or two passive tuning sections', IEEE Journal of Quantum Electronics, vol. 25, No. 6, Jun. 1989, New York US, pp. 1254–1260.

(List continued on next page.)

Primary Examiner—Leon Scott, Jr.
Attorney, Agent, or Firm—Fitzpatrick, Cella, Harper & Scinto

[57] ABSTRACT

A driving method of the present invention drives a semiconductor laser which is provided with at least first and second electrodes through each of which current is injected into the semiconductor laser. Varying current is injected through the first electrode when the frequency of the varying current is in a high frequency band. Varying current is injected through the first electrode while phase-shifted current, whose phase is shifted relative to the varying current, is injected through the second electrode, when the frequency of the varying current is in a low frequency band which is lower than the frequency of the high frequency band. Feedback-control may be performed for controlling a ratio between amplitudes of the modulation current and the phase-shifted current based on a light output from the semiconductor laser. The varying current includes at least modulation current modulated according to a predetermined signal or negative feedback current produced by an electric signal obtained by detecting fluctuation of oscillation wavelength of a light output from the semiconductor laser. Thus, an optical signal radiated from the laser can be desirably stabilized over a wide frequency band range.

70 Claims, 23 Drawing Sheets

OTHER PUBLICATIONS

E. Goobar et al, 'Characterisation of the modulation and noise properties of a Three electrode DFB laser', IEEE Photonics Technology Letters, vol. 4, No. 5, May 1992, New York US, pp. 414–416.

O. Ishida et al, 'Pure frequency modulation of a multielectrode DBR laser diode', IEEE Photonics Technology Letters, vol. 1, No. 7, Jul. 1989, New York US, pp. 156–158.

W.B. Hale et al, 'Vector modulation of split contact DFB lasers', IEEE Proceedings J. Optoelectronics, vol. 138, No. 2, Apr. 1991, Stevenage GB, pp. 109–112.

O. Nilsson et al, 'Small signal response of a semiconductor laser with inhomogeneous linewidth enhancement factor: possibilities of a flat carrier induced FM response', Applied Physics Letters, vol. 46, No. 3, Feb. 1, 1985, New York US, pp. 223–225.

"Multielectrode Distributed Feedback Laser For Pure Frequency Modulation And Chirping Suppressed Amplitude Modulation", Y. Yoshikuni, et al., Journal of Lightwave Technology, vol. LT–5 No. 4, Apr. 1987, pp. 516–522.

Y. Yoshikuni et al, 'Multielectrode DFB laser for pure frequency modulation and chirping suppressed amplitude modulation', Journal of Lightwave Technology, vol. LT–5, No. 4, Apr. 1987, New York US, pp. 516–522.

B. Glance et al, 'Optical frequency synthesiser', Electronics Letters, vol. 25, No. 17, Aug. 17, 1989, Stevenage, Herts, GB, pp. 1193–1195.

E.A. Swanson et al, 'Wideband frequency noise reduction and FM equalisation in AlGaAs lasers using electrical feedback', Optics Letters, vol. 16, No. 18, Sep. 15, 1991, New York US, pp. 1403–1405.

(a) FREQUENCY = 1MHz (b) FREQUENCY = 100MHz

METHOD AND APPARATUS FOR FREQUENCY MODULATING A SEMICONDUCTOR LASER, AND AN OPTICAL COMMUNICATION SYSTEM USING THE SAME

This application is a continuation of application Ser. No. 08/573,209 filed Dec. 13, 1995, now abandoned, which is a continuation of application Ser. No. 08/306,613 filed Sep. 15, 1994, which is now abandoned.

BACKGROUND OF THE INVENTION

1. Field of the Invention

The present invention relates to a driving method and a driving apparatus for a semiconductor laser, and an optical communication method and system using the driving method and apparatus. The present invention also relates to a modulation method for a semiconductor laser that is used as a light source for optical communications, in which a modulation signal for driving the laser is caused to be in-phase with an optically modulated signal radiated from the laser over a wide modulation frequency band. The present invention further relates to a driving method for a semiconductor laser for stabilizing and narrowing the spectral line-width of an oscillation wavelength of the laser even if the frequency of fluctuation of the spectrum of oscillation wavelength or optical frequency is low. Within the spectral line-width, the oscillation wavelength of the laser fluctuates with time.

2. Related Background Art

Conventionally, a distributed feedback laser (DFB laser), that radiates in a single longitudinal or axial mode, has been developed as a light source for optical communications, for example.

In a direct optical intensity or amplitude modulation system, which is presently put into practice using the above laser (also referred to as LD hereinafter), the amplitude of a modulation current required for driving LD needs to be set around several tens of mA. In addition, the bias current point of LD needs to be close to its threshold. As a result, the resonance frequency due to relaxation vibration is low, and hence such LD is unsuitable for high-frequency modulation of more than several Gbps. The phenomenon of such resonance is observed in the high-frequency modulation of LD. Furthermore, the fluctuation of the oscillation wavelength during the modulation of LD is large, leading to the problem of wavelength dispersion of signals during long-distance transmissions through an optical fiber and the problem of crosstalk between channels in wavelength division multiplexing (WDM) communications.

On the other hand, in a direct frequency modulation system, which utilizes modulation current injection into LD, the amplitude of modulation current is small, e.g. about several mA, and the bias current point of LD is above its threshold. Thus, LD is constantly modulated while oscillating. Therefore, a direct frequency modulation system is capable of modulation in a wide bandwidth, and its oscillation wavelength fluctuation is small. Thus, the direct frequency modulation system is promising for use in long-distance transmissions and wavelength division multiplexing communications.

When coherent optical communication is employed to apply that direct frequency modulation system to super long-distance transmissions or high-density optical frequency division multiplexing systems, the spectral line-width of a light source should be narrowed and the oscillation wavelength of the light source should be highly stabilized. Narrowing and stabilization can be achieved by an electrical negative feedback control. Also, in this case, the direct frequency modulation characteristic of LD is utilized. Such techniques for stabilization may also be applied to optical measurements.

The direct frequency modulation characteristics of the laser are, however, degraded in a low-frequency range less than several MHz. This is a considerable problem. For example, when a single-electrode DFB laser as shown in FIG. 1 is modulated with a sinusoidal wave current, the relationship between modulation frequency and modulation efficiency (the amount of an optical frequency shift caused by a change in current of 1 mA) varies with modulation efficiency increasing as modulation frequency enters the low frequency region. as shown in FIG. 2. The relationship between modulation frequency and phase difference (a phase difference between modulation current injected into LD and modulation optical signal emitted by LD) also varies, with phase difference increasing to approximately 180 degrees, as modulation frequency decreases to the low frequency region, as illustrated in FIG. 3. It can be seen therefrom that the modulation efficiency fluctuates in a frequency band range less than several MHz and the phase difference also fluctuates and exibits a reverse or anti-phase (a phase shift by about 180 degrees) response as the modulation frequency decreases from approximately 10 MHz and and approaches zero. The reason therefor is that the laser's direct frequency modulation characteristics result from the superposition of competing physical mechanisms; an anti-phase refractive index variation due to heat (a change in the refractive index due to a change in heat in LD shifts in phase relative to the change in heat by 180 degrees), which has a cutoff frequency around several MHz, and the effect of an in-phase refractive index variation due to carrier density (no phase shift of a change in the refractive index due to a change in carrier density in LD occurs relative to the phase of the change in carrier density), which is flat or unchanged up to the resonance frequency. Since the effect of heat is dominant in a low-frequency band range, the flatness of the modulation characteristic is destroyed as discussed above.

Various problems arise when those adverse characteristics appear. First of all, in the case of frequency shift keying (FSK) in which digital signals are transmitted as a frequency modulation, an optically modulated waveform is phase shifted, causing a transmission error, when a modulation frequency falls below several MHz. FIGS. 4A and 4B show such an example. As illustrated in FIG. 4A, the optically modulated pulse width thins when the modulation pulse width is around 1 MHz, and as shown in FIG. 4B the optical waveform is inverted or in an anti-phase with the modulation signal when the modulation frequency is aroud 100 kHz. Therefore, there is a limit to modulation frequency in a low frequency band range, and a freedom in coding is therefore restricted.

Furthermore, when the spectral line-width of LD is narrowed by applying an electric negative feedback thereto, the phase of a change in the total refractive index shifts from the desired if its oscillation wavelength fluctuation has a frequency less than several MHz. Hence the negative feedback control of LD becomes difficult to achieve.

Several methods for improving a semiconductor laser apparatus have been proposed to solve those problems. For example, a three-electrode structure is built as shown in FIG. 5 and a current, injected through end electrodes or central electrode 1045, is modulated to suppress the effect of heat mentioned above (see Yuzo Yoshikuni, et al., IEEE J.

Lightwave Technol., vol. LT-5, No. 4, 516, April, 1987). In this case, however, its behaviour varies depending on the amount of bias current injected through each electrode, and variation among devices exists. Thus, such a structure is difficult to put into a practical use. In FIG. 5, reference numeral 1041 designates a substrate, reference numeral 1042 designates an active layer, reference numeral 1043 designates a clad layer, and reference numeral 1044 designates a grating.

Another conventional device has a λ/4-shifted diffraction grating 1052, with the depth of the diffraction grating 1052 at a central portion 1056, being larger than that at peripheral portions as shown in FIG. 6. In this device, current injected through a central electrode 1055 is modulated, causing the effects of carrier density mentioned above to exhibit an anti-phase response so as to be in-phase with the effects of heat. As a result, the phase shift of the change in the total refractive index from the desired is eliminated, and further the effect of heat can be reduced. Thus, the characteristic in a low modulation frequency band range is improved (see H. Shoji, et al., Informal Paper of 1992 Vernal Conference of Japan Applied Physics Society, 30a-SF-8). This device, however, has the problem that its manufacturing is complicated, leading to poor yield and a high manufacturing cost. In FIG. 6, reference numeral 1051 designates a substrate, reference numeral 1053 designates a light guide layer, and reference numeral 1054 designates an active layer.

SUMMARY OF THE INVENTION

It is an object of the present invention to solve the above problems by a relatively simple driving method and a driving apparatus of a semiconductor laser and an optical communication method and system using the driving method and apparatus.

The object of the present invention is achieved by the following driving method and a driving apparatus of a semiconductor laser and an optical communication method and system using the driving method and apparatus.

One aspect of the present invention provides a driving method of driving a semiconductor laser which is provided with at least first and second electrodes through each of which current is injected into the semiconductor laser, wherein the following steps are performed:

injecting varying current through the first electrode when the frequency band of the varying current is a high frequency band; and injecting varying current through the first electrode while injecting phase-shifted (typically 180-degree phase-shifted or anti-phase) current, whose phase is shifted relative to the varying current, through the second electrode when the frequency band of the varying current is a low frequency band which is lower than the frequency of the high frequency band.

Another aspect of the present invention provides a driving apparatus of driving a semiconductor laser which is provided with at least first and second electrodes through each of which current is injected into the semiconductor laser, for performing the above driving method. This driving apparatus comprises first injecting means for injecting varying current through the first electrode when the frequency band of the varying current is a high frequency band, and second injecting means for injecting varying current through the first electrode while injecting phase-shifted current, whose phase is shifted relative to the varying current, through the second electrode when the frequency band of the varying current is a low frequency band which is lower than the frequency of the high frequency band.

Still another aspect of the present invention provides a driving method of frequency-modulating a semiconductor laser by directly injecting modulation current into the semiconductor laser which is provided with at least first and second electrodes through each of which current is injected. This driving method comprises a step of injecting modulation current through the first electrode when the frequency band of the modulation current is a high frequency band, and a step of injecting modulation current through the first electrode while injecting another modulation current, which is anti-phase with the modulation current injected through the first electrode, through the second electrode when the frequency band of the modulation current is a low frequency band which is lower than the high frequency band.

Still another aspect of the present invention provides a driving apparatus for frequency-modulating a semiconductor laser by directly injecting modulation current into the semiconductor laser which is provided with at least first and second electrodes through each of which current is injected.

This driving apparatus comprises:

signal generating means for generating two signals each of which includes at least a modulation signal;

a first amplifier whose cutoff frequency is more than several GHz, said first amplifier receiving one of the two signals to supply a first output;

first injection means for cutting a DC-component of the first output and superposing the DC-component cut first output on first bias current to inject its superposed current into the semiconductor laser through the first electrode;

a second amplifier whose cutoff frequency is lower than the cutoff frequency of said first amplifier, said second amplifier receiving the other of the two signals to supply a second output which is anti-phase with the first output; and second injection means for cutting a DC-component of the second output and superposing the DC-component cut second output on second bias current to inject its superposed current into the semiconductor laser through the second electrode.

Still another aspect of the present invention provides a driving apparatus for frequency-modulating a semiconductor laser by directly injecting modulation current into the semiconductor laser which is provided with at least first and second electrodes through each of which current is injected.

This driving apparatus comprises:

signal generating means for generating two signals each of which includes at least a modulation signal;

a first voltage-current converter for supplying an anti-phase output, said first voltage-current converter injecting one of the two signals together with first bias current into the semiconductor laser through the first electrode, as the anti-phase output;

a second voltage-current converter for supplying an in-phase output, said second voltage-current converter injecting the other of the two signals together with second bias current into the semiconductor through the second electrode, as the in-phase output which is anti-phase with the anti-phase output; and a first low pass filter, said low pass filter being disposed between one of said first and second voltage-current converters and the semiconductor laser.

Still another aspect of the present invention provides a driving method of narrowing an oscillation spectral line width of a semiconductor laser which is provided with at least first and second electrodes through each of which current is injected into the semiconductor laser, wherein the following steps are performed:

obtaining an electric signal by detecting fluctuation of oscillation wavelength of a light output from the semiconductor laser;

injecting negative feedback current produced from the electric signal, through the first electrode, when the frequency band of the electric signal is a high frequency band; and injecting negative feedback current produced from the electric signal, through the first electrode, while injecting anti-phase current, which is anti-phase with the negative feedback current produced from the electric signal, through the second electrode when the frequency band of the electric signal is a low frequency band which is lower than the high frequency band.

Still another aspect of the present invention provides a driving apparatus for narrowing an oscillation spectral line width of a semiconductor laser which is provided with at least first and second electrodes through each of which current is injected.

This driving apparatus comprises:

signal generating means for generating two signals;

a first amplifier whose cutoff frequency is more than several GHz, said first amplifier receiving one of the two signals to supply a first output;

first injection means for cutting a DC-component of the first output and superposing the DC-component cut first output on first bias current to inject its superposed current into the semiconductor laser through the first electrode;

a second amplifier whose cutoff frequency is lower than the cutoff frequency of said first amplifier, said second amplifier receiving the other of the two signals to supply a second output which is anti-phase with the first output; and second injection means for cutting a DC-component of the second output and superposing the DC-component cut second output on second bias current to inject its superposed current into the semiconductor laser through the second electrode.

Still another aspect of the present invention provides a driving apparatus for narrowing an oscillation spectral line width of a semiconductor laser which is provided with at least first and second electrodes through each of which current is injected.

This driving apparatus comprises:

signal generating means for generating two signals;

a first voltage-current converter for supplying an anti-phase output, said first voltage-current converter injecting one of the two signals together with first bias current into the semiconductor laser through the first electrode, as the anti-phase output;

a second voltage-current converter for supplying an in-phase output, said second voltage-current converter injecting the other of the two signals together with second bias current into the semiconductor through the second electrode, as the in-phase output which is anti-phase with the anti-phase output; and a first low pass filter, said low pass filter being disposed between one of said first and second voltage-current converters and the semiconductor laser.

Still another aspect of the present invention provides a coherent optical communication method, in which transmission light modulated according to any of the above driving methods is transmitted through an optical fiber and a beat detection is conducted by using a local oscillator on a receiver side.

Still another aspect of the present invention provide an optical communication method, in which transmission light modulated according to any of the above driving methods is transmitted through an optical fiber and a direct detection is conducted by using a wavelength filter on a receiver side.

Still another aspect of the present invention provides a wavelength division multiplexing transmission type of optical communication method, in which a plurality of transmission light sources are connected to a single optical fiber, modulated signals at a plurality of wavelengths from the transmission light sources are transmitted through the optical fiber, the modulated signal of a desired wavelength is selected out on a receiver side, and the optical transmission per each wavelength is performed according to any of the above optical communication methods.

Still another aspect of the present invention provides a wavelength division multiplexing transmission type of optical communication system, in which a plurality of nodes are connected to a single optical fiber, modulated signals at a plurality of wavelengths are transmitted through the optical fiber, each node comprises an opto-electric converting apparatus which includes a transmitter portion and a receiver portion, and the optical transmission is performed according to any of the above optical communication methods.

Still another aspect of the present invention provides an optical cable television system for communicating over an optical fiber that transmits signal light from a broadcasting center to a subscriber side, in which the broadcasting center drives a semiconductor laser by any of the above driving methods to transmit the signal light, and the subscriber side receives the signal light by using a local oscillator to perform a beat detection, or by performing a direct detection through a wavelength filter.

These advantages and others will be more readily understood in connection with the following detailed description of the preferred embodiments in conjunction with the drawings.

DESCRIPTION OF THE PREFERRED EMBODIMENTS

First Embodiment

Figure 7:
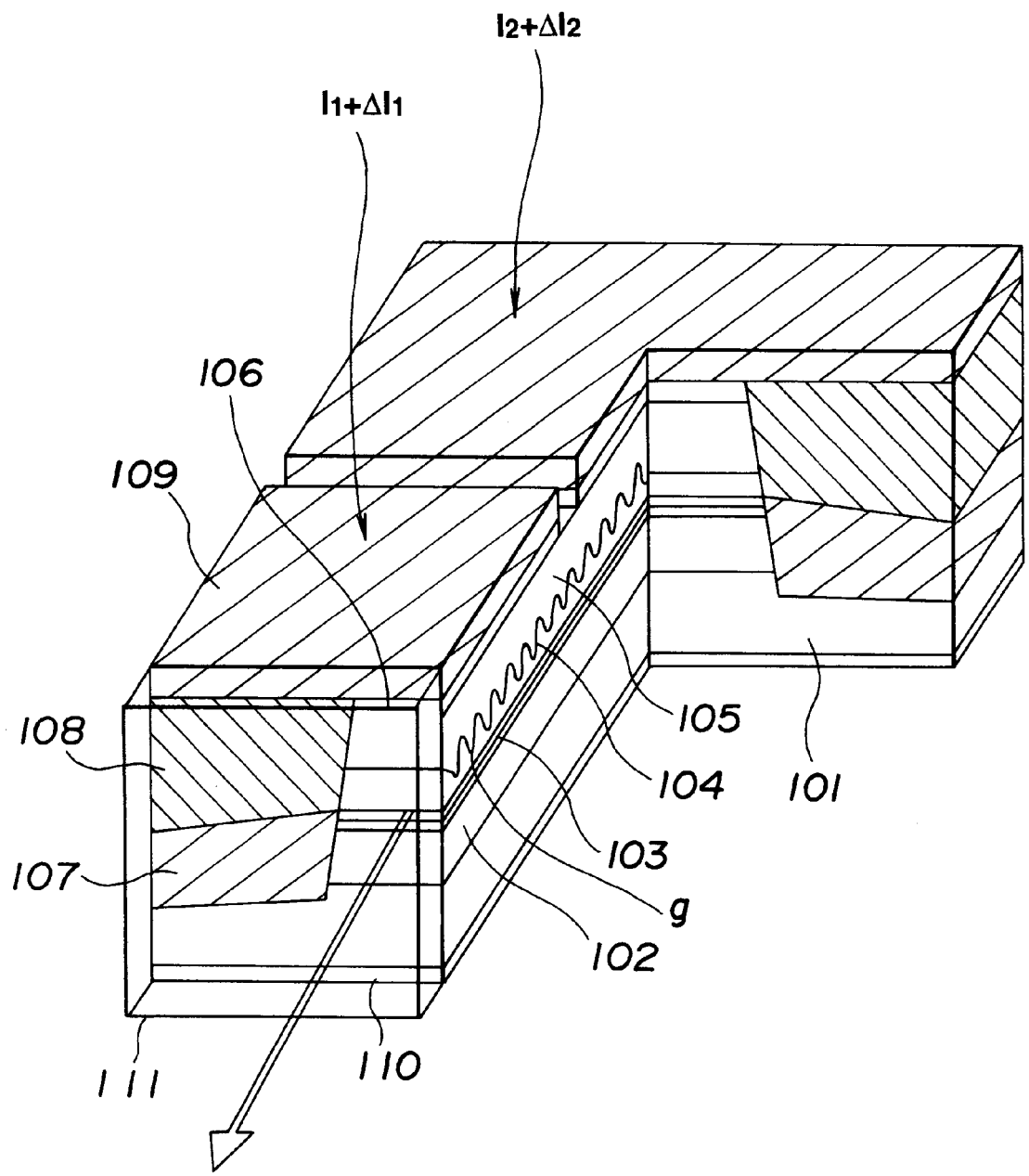
FIG. 7 is a perspective cross section view showing a distributed feedback semiconductor laser which is used in a driving method of the present invention.
Figure 8:
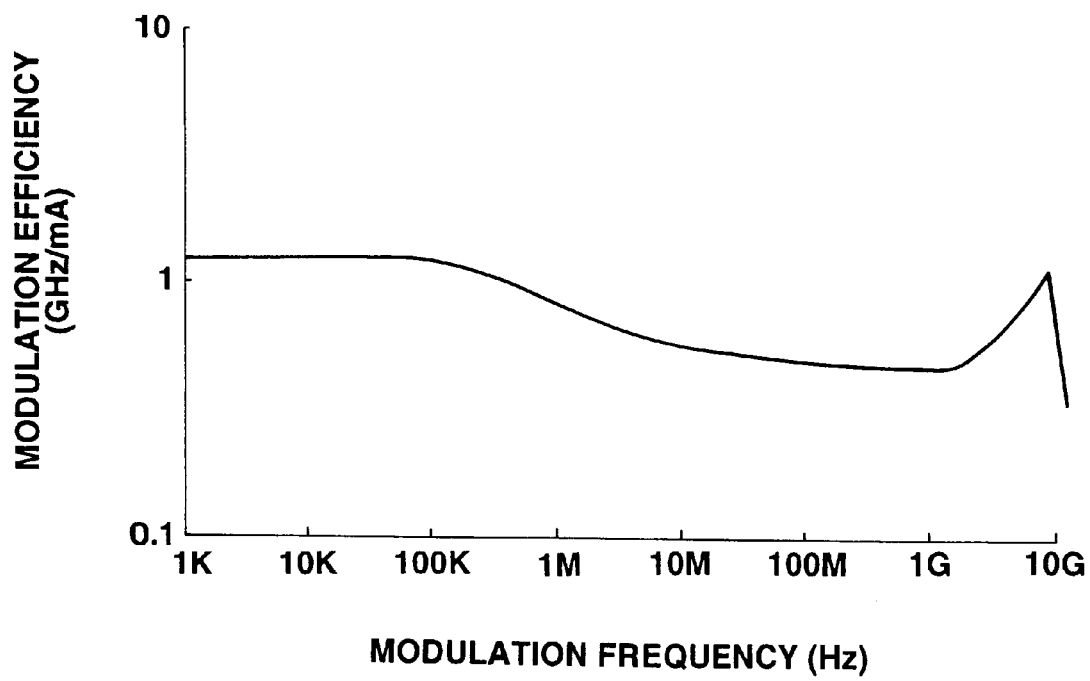
FIG. 8 is a graph illustrating a modulation characteristic when current injected only through one of two electrodes is frequency-modulated.
Figure 9:
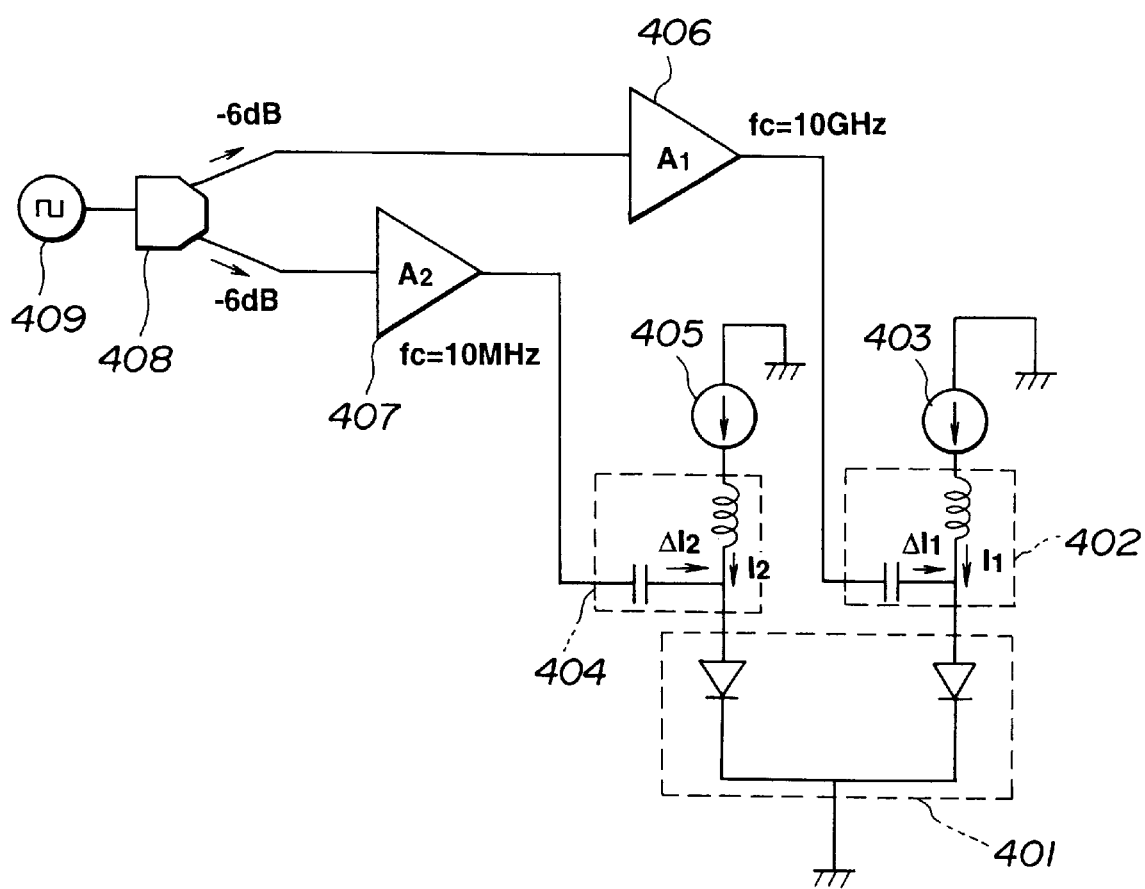
FIG. 9 is a-schematic block diagram illustrating a driving circuit, according to a first embodiment of the present invention.

A first embodiment of the present invention will be described with reference to FIGS. 7–10. FIG. 7 shows a two-electrode DFB laser which is used for performing a driving method of the present invention. FIG. 9 shows a driving system of the first embodiment.

In FIG. 7, reference numeral 101 is an n-type GaAs substrate, reference numeral 102 is an n-type $Al_xGa_{1-x}As$ (x=0.45) clad layer, reference numeral 103 is a multiple quantum well active layer comprising five i(intrinsic)-GaAs well layers (thickness: 6 nm) and six i-$Al_xGa_{1-x}As$ barrier layers (x=0.22, thickness: 10 nm), which are layered alternately, reference numeral 104 is a p-type $Al_xGa_{1-x}As$ (x=0.15) light guide layer, reference numeral 105 is a p-type $Al_xGa_{1-x}As$ (x=0.45) clad layer, reference numeral 106 is a p-type $Al_xGa_{1-x}As$ (x=0.05) contact layer, reference numeral 107 is a p-type $Al_xGa_{1-x}As$ (x=0.4) burying layer, reference numeral 108 is an n-type $Al_xGa_{1-x}As$ (x=0.4) burying layer, reference numeral 109 is a p-type electrode, and reference numeral 110 is an n-type electrode. A grating g having a pitch of 245 nm and a depth of 100 nm is formed on the light guide layer 104, and an antireflection coating 111 is provided on one of light-emerging end faces. The p-electrode 109 and the contact layer 106 are each divided into two portions by a space, provided at the device's center as shown in FIG. 7.

Figure 3:
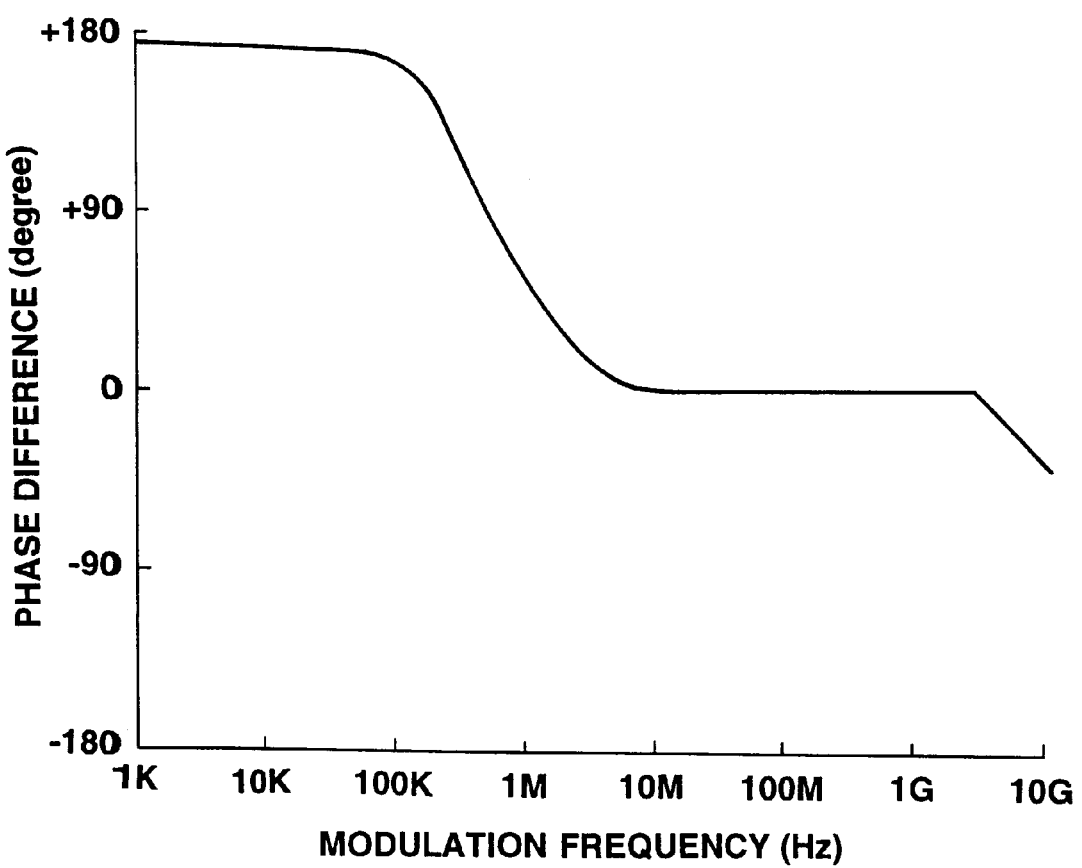
FIG. 3 is a graph illustrating a prior art phase characteristic.
Figure 4A:
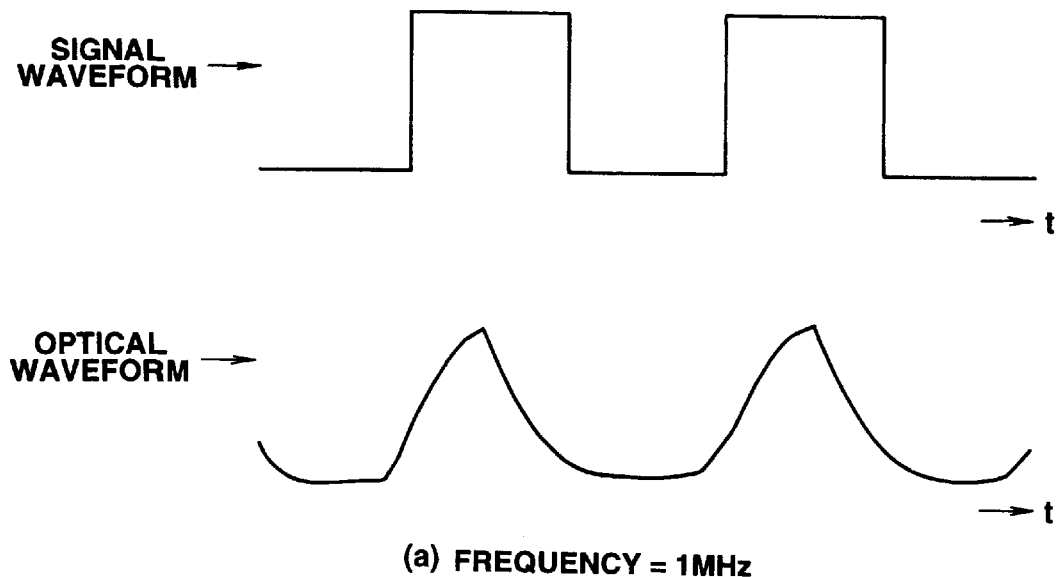
FIGS. 4A and 4B are respectively views illustrating prior art FSK response characteristics.
Figure 4B:
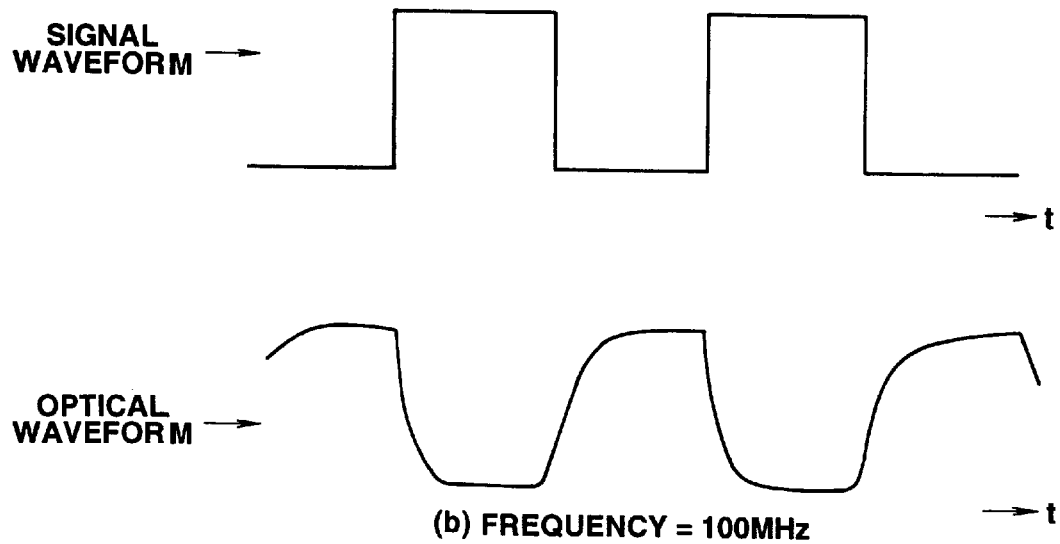
Figure 5:
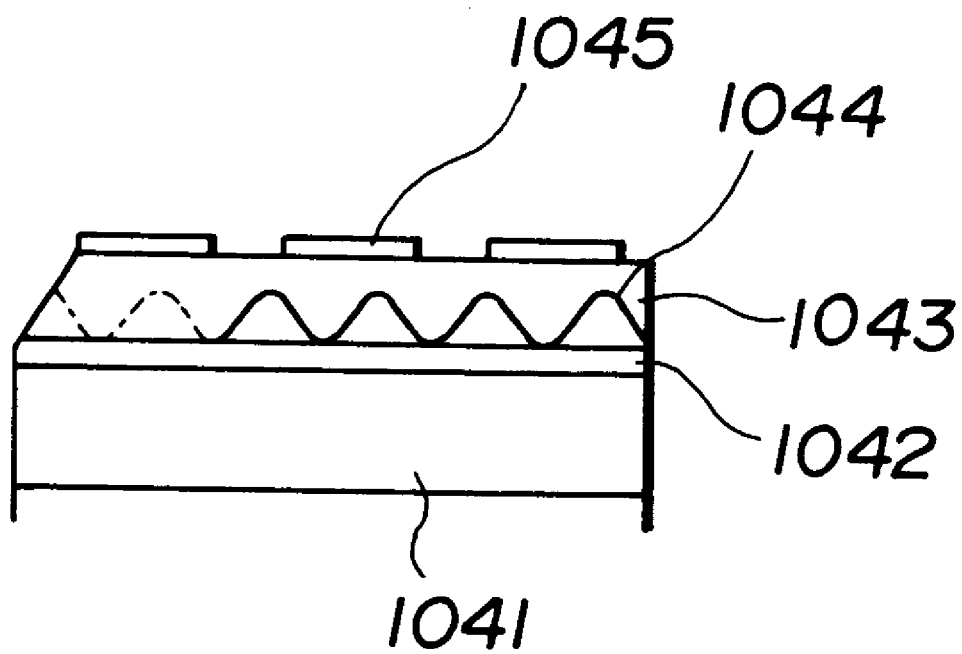
FIG. 5 is a cross section view illustrating a prior art three-electrode distributed feedback laser.
Figure 6:
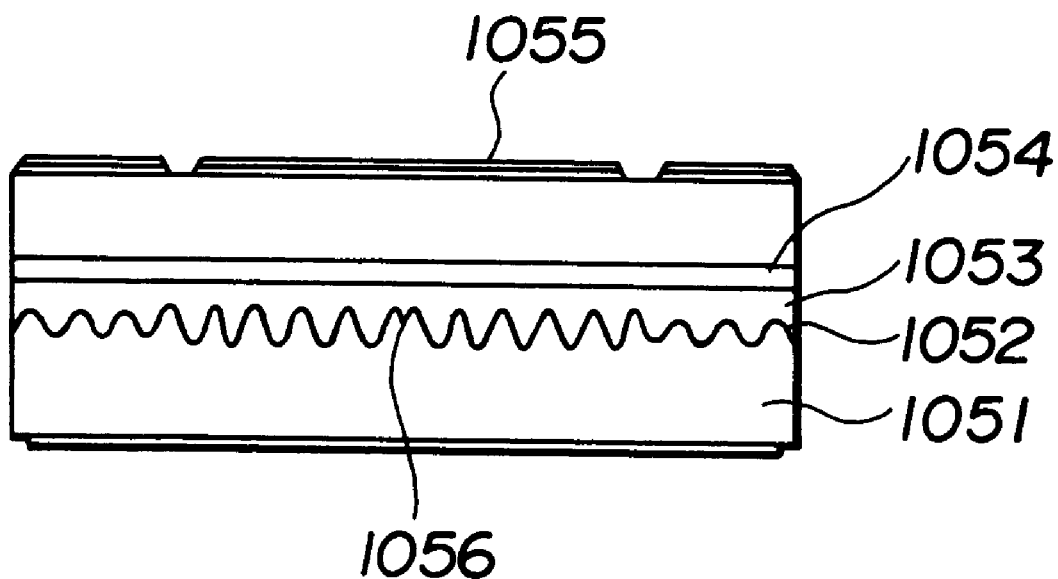
FIG. 6 is a cross section view illustrating a prior art distributed feedback laser which has a grating having an uneven depth.

Bias current $I_1$ is caused to flow through the electrode 109 on the side nearest the antireflection coating 111, and bias current $I_2$ is caused to flow through the electrode 109 on the other side. The oscillation in a DFB mode is caused by a threshold of approximately $I_1+I_2$=30 mA ($I_1,I_2$>10 mA). In the oscillated state, a high-frequency modulation current $\Delta I_1$ is superposed only on the bias current $I_1$ by a bias T, which is a means for alternating current (AC) coupling, to perform the frequency modulation. The modulation characteristic at this time is illustrated in FIG. 8. The modulation efficiency remains flat or constant at about 0.6 GHz/mA over a range of the modulation frequency from several MHz to several GHz. It can be seen from FIG. 8 that the modulation efficiency increases when the modulation frequency is in a range less than several MHz. This results from the fact that the effect of heat is great and dominant in a low modulation frequency range as described above. The phase difference characteristic is similar to that of a conventional device shown in FIG. 3.

Therefore, compensation current $\Delta I_2$ is superposed on the bias current $I_2$ by using a structure as shown in FIG. 9. In the structure of FIG. 9, a modulation signal from a modulation electric source 409 is divided into two current output portions having a 1:1 ratio by a power divider 408. One output is provided to an inverting type wideband video amplifier 406 whose gain and cutoff frequency are respectively approximately 10 and 10 GHz. Then, the amplified current, $\Delta I_1$, is superposed on a DC current $I_1$, provided by a DC current source 403 by means of a bias T 402 which is constructed from a solenoid and a capacitor, having component values chosen to provided a low frequency cutoff of about 1 kHz. The capacitor further allows DC components, such as offsets, to be removed from the amplified current $\Delta I_1$. The thus-superposed current $(I_1+\Delta I_1)$ drives a semiconductor laser 401. The laser 401 is depicted by using a pair of diodes. The other current output of the power divider 408 is input into a non-inverting type operational amplifier 407 whose gain and cutoff frequency are respectively about 3 and 10 MHz. Similarly, its amplified current $\Delta I_2$ is superposed on DC current $I_2$ from a DC current source 405 by a bias T 404, and another superposed current $(I_2+\Delta I_2)$ also drives the laser 401. In this case, the output of the modulation electric source 409 is variable, and a modulation index is adjusted by varying the output of modulation source 409. The modulation index is a ratio between maximum and minimum current of the superposed modulation current.

In the first embodiment, to effectively suppress the phase difference due to the effect of heat in a low modulation frequency band range and render the modulation operation optimum, the gain of the inverting wideband video amplifier 406 is fixed at a value of about 10, and the gain of the non-inverting operational amplifier 407 is varied until the desired characteristics are achieved. As a result, the gain of the non-inverting operational amplifier 407 is preferably about 3. The gain values will differ depending on the device structure, material, packaging configuration and the like, and therefore, they need to be adjusted to optimum values for each application.

Figure 10:
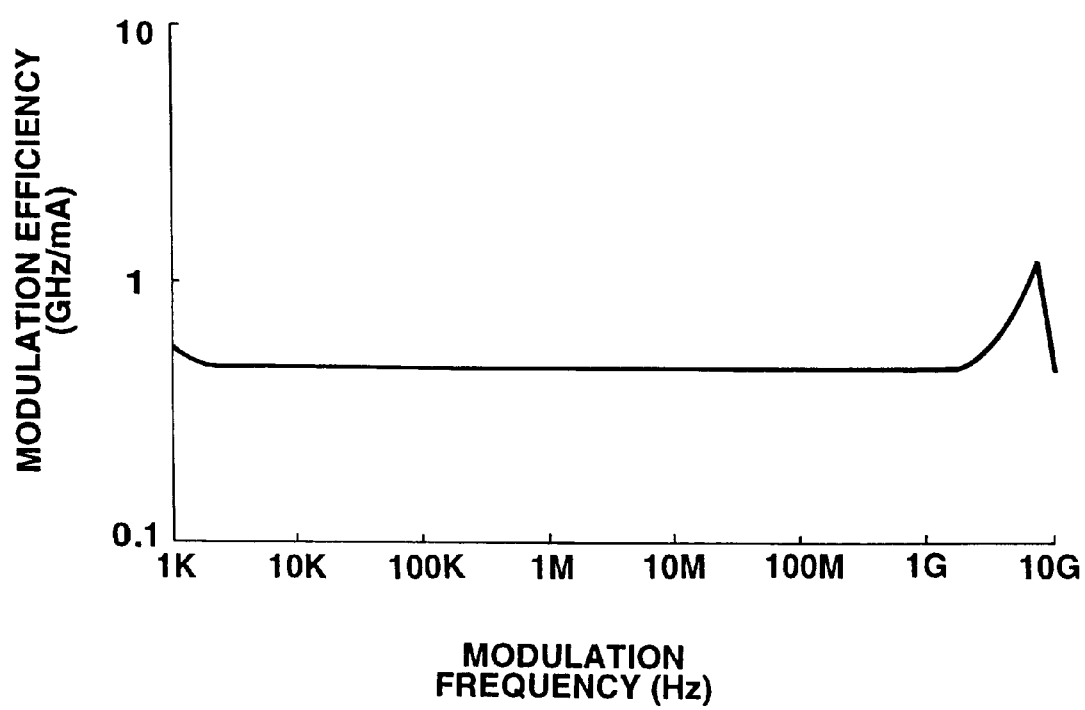
FIG. 10 is a graph illustrating a modulation characteristic when frequency modulation is performed according to a driving method of the present invention.

When frequency modulation is performed according to the above embodiment, the low-frequency band modulation characteristic is highly improved as illustrated in FIG. 10. Thus, a flat modulation characteristic is obtained over a range down to several kHz. At the same time, the phase difference characteristic exhibits an in-phase response in a range from several kHz to about 1 GHz. Consequently, even a simple-structure DFB laser can achieve a frequency modulation with a square wave signal, whose frequency is from several kHz to several GHz, or FSK transmission.

Further, the wideband video amplifier 406 is preferably an inverting type and the operational amplifier 407 is preferably a non-inverting type in the first embodiment. This is only because an inverting type wideband amplifier has generally superior noise and offset characteristics than other types. However, a non-inverting wide band video amplifier and an inverting operational amplifier may alternatively be used without departing from the spirit of the invention.

As described above, the above-discussed problem can be solved without complicating the structure of a device very much.

Figure 1:
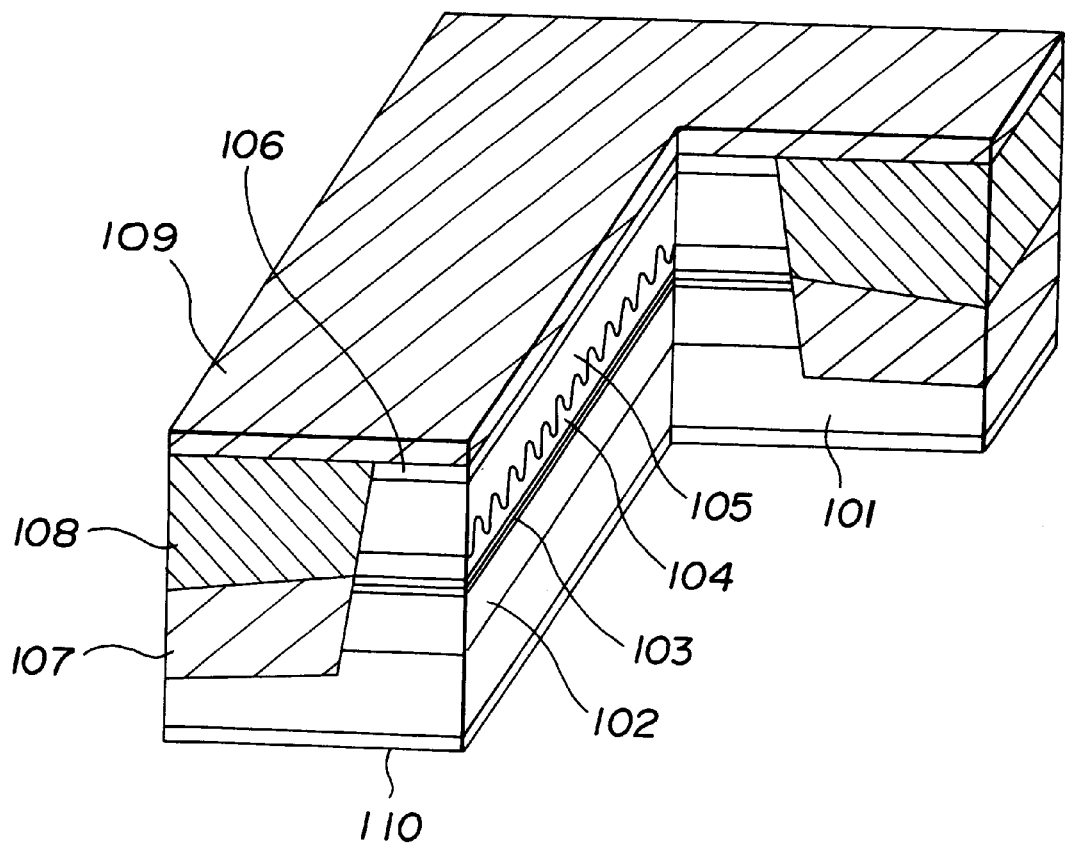
FIG. 1 is a perspective, cross sectional view illustrating a single-electrode distributed feedback laser.
Figure 2:
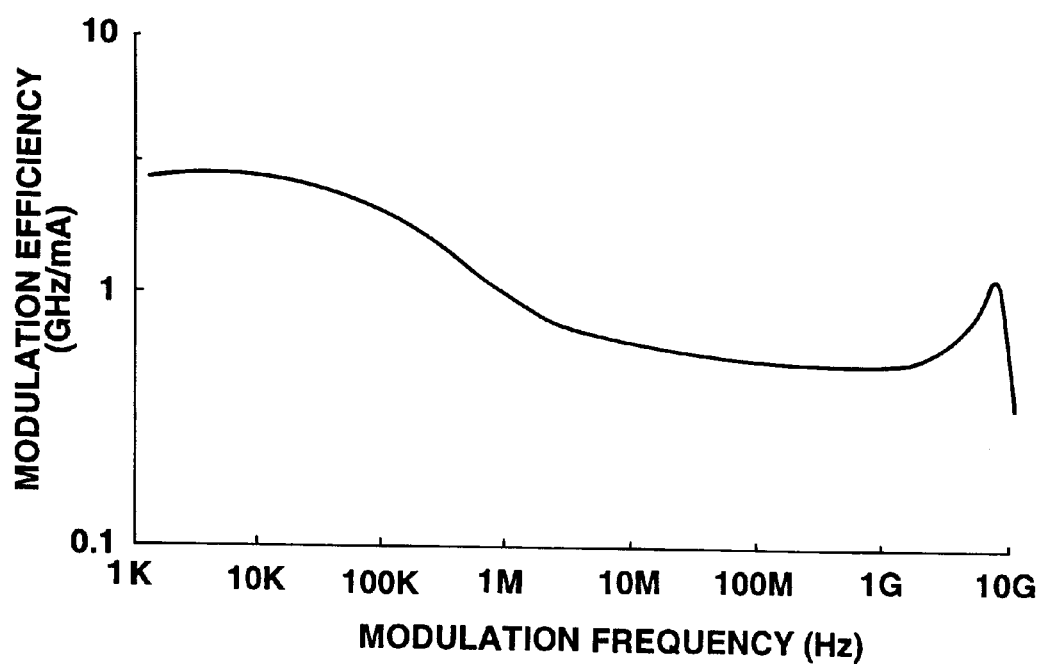
FIG. 2 is a graph illustrating a prior art frequency modulation characteristic.

The principle of operation will briefly be summarized using a concrete example. A two-electrode DFB laser as shown in FIG. 7 is prepared. When current is injected only through one electrode, the modulation characteristic is as shown in FIG. 8. In this case, the effect of heat in a low-frequency band range is reduced compared with the laser as shown in FIG. 1, but yet the desirable flat region extends only down to about several MHz. Therefore, a phase-shifted or anti-phase signal synchronized with the modulation signal is injected through another electrode when the modulation frequency is in a low-frequency (less than several tens MHz) band range. The magnitude of the phase-shifted current varies depending on material, structure and packaging configuration of devices. This magnitude is adjusted to an optimum value by adjusting the gains of the respective amplifiers 406 and 407 so that the phase difference between the modulation current injected through the first electrode and a light output from the laser ia maintained at zero over a low-frequency band range. Then, the low-frequency characteristic can be extended down to several kHz as shown in FIG. 10.

Such a means for generating an anti-phase signal can be constructed in various manners. Such means can be readily realized since only a low-frequency band range, extending from about DC to about 10–20 MHz, needs to be considered. One example is shown in FIG. 9.

Second Embodiment

Figure 11:
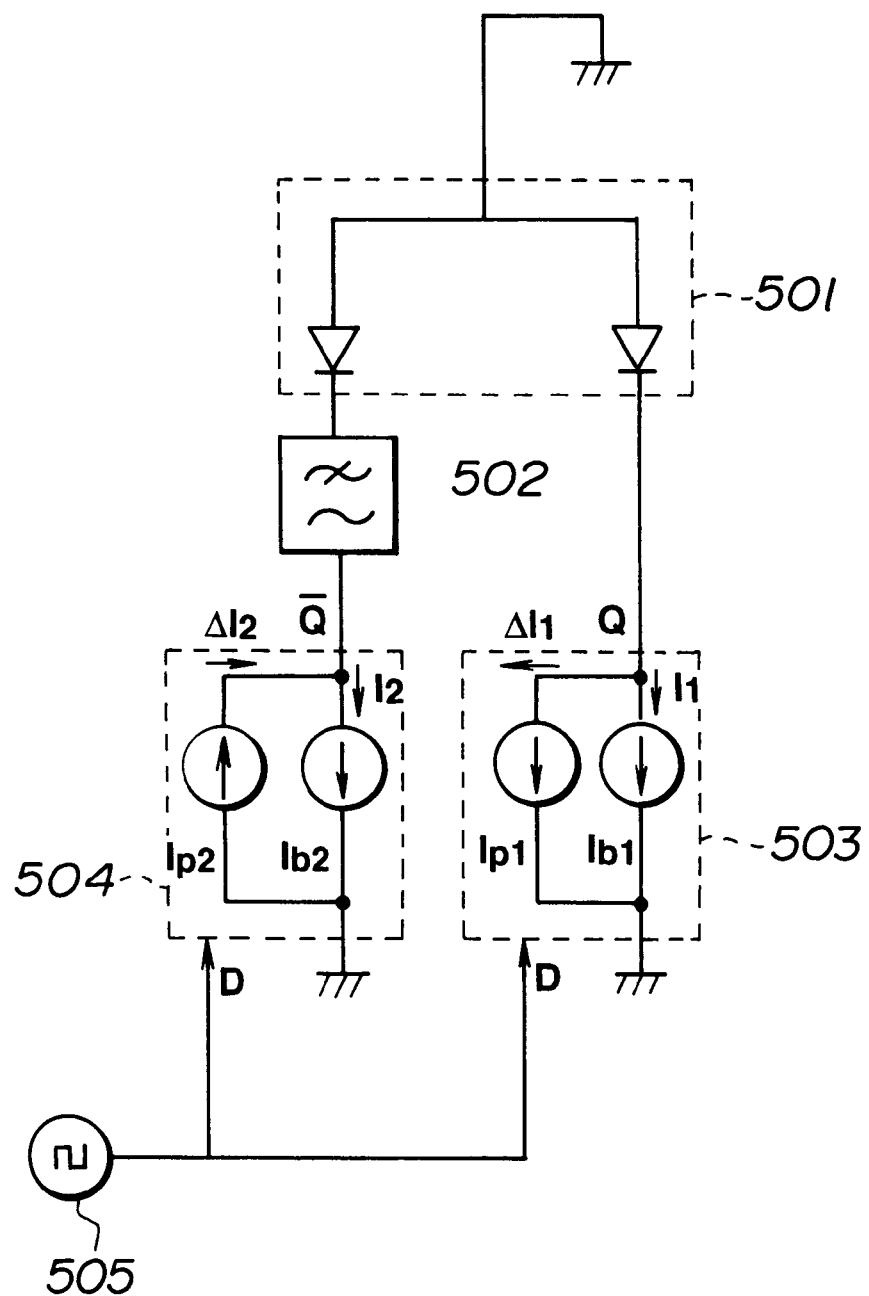
FIG. 11 is a schematic block diagram illustrating a driving circuit, according to a second embodiment of the present invention.

A second embodiment of the present invention will be described with reference to FIG. 11. A laser device used in connection with this embodiment is substantially the same as the two-electrode DFB laser used in the first embodiment.

In this embodiment, no bias T's having a low-frequency cutoff are used, and instead a conventional laser driver integrated circuit (IC) is preferably used as a voltage-current converter, which is a coupling device that can be modulated, to reduce the size of the entire driving system. The voltage-current converter supplies driving current by using a voltage signal. In respective driver ICs 503 and 504, DC current sources $I_{b1}$ and $I_{b2}$ and modulation current sources $I_{p1}$ and $I_{p2}$ are connected in a parallel arrangement, and modulation currents $\Delta I_1$ and $\Delta I_2$ having DC offset currents $I_1$ and $I_2$ can be supplied respectively therefrom by inputting thereinto a modulation signal from a modulation signal source 505. The modulation index and bias current amount can be controlled on the IC side, respectively, as described above.

Next, a particular driving method will be described. The output of a modulation current source 505 is supplied to the driver ICs 503 and 504. When the signal from the modulation electric source 505 is divided into two portions, no power divider is necessary if the division is conducted immediately before the two driver ICs 503 and 504. The driver IC 503 supplies an in-phase output, which is in-phase with the modulation signal input, to a laser 501 as driving current $I_1+\Delta I_1$. The driver IC 504 supplies an anti-phase output which is anti-phase with the modulation signal input. This can be performed by a single driver IC which can supply in-phase and anti-phase outputs. The anti-phase output is input into a low pass filter 502, which has a cutoff frequency of about 10 MHz, and the ouput of the low pass filter 502 is supplied to a laser 501 as driving current of $I_2+\Delta I_2$. The current magnitude ratio between $\Delta I_1$ and $\Delta I_2$ is made optimum at about 10:3, similar to the first embodiment. The driver IC is preferably designed as shown in FIG. 11, wherein the laser 501 is grounded on its upper side to draw current thereinto, so that a high-speed modulation operation can be obtained. Therefore, in this embodiment, the conduction type of the laser 501 is opposite to that shown in FIG. 7. That is, a p-type substrate is used and the electrode is divided into two portions on the side of an n-type electrode.

When the driving system is constructed as above, the entire system can be made very compact in size, and can be put into a single box as a module. While the lower limit of a low modulation frequency range is limited by the cutoff frequency of the bias T in the first embodiment, there is no lower limit concerning a low modulation frequency range in the second embodiment. As a result, the low modulation frequency characteristic can be further improved, and the modulation frequency characteristic can be flattened over a modulation frequency range between about 100 Hz and several GHz. Thus, when FSK transmission is conducted, information can be coded by using No Return Zero (NRZ) signal whose frequency and continuity are respectively 3 Gbps and more than $2^{20}-1$, for example. Consequently a very high-speed transmission can be attained.

Third Embodiment

Figure 12:
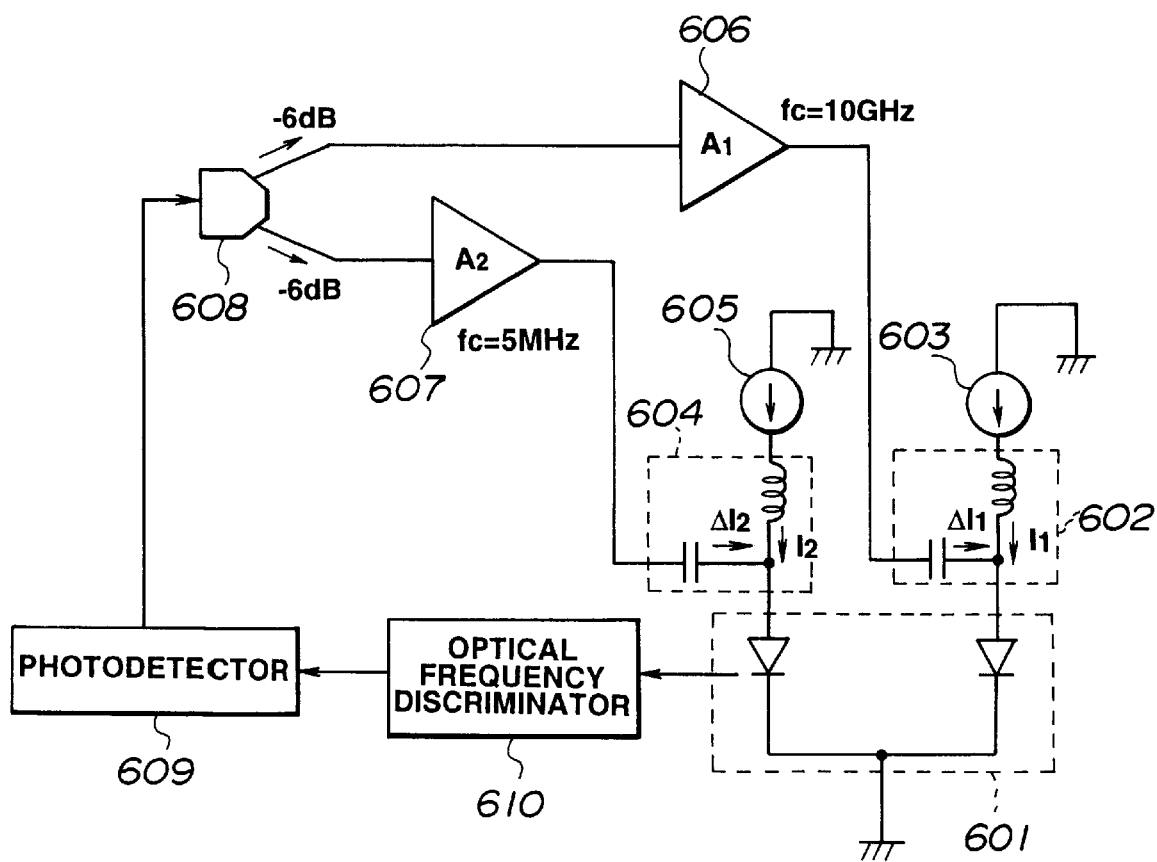
FIG. 12 is a schematic block diagram illustrating a driving circuit for narrowing spectral line-width according to a third embodiment of the present invention.

In a third embodiment of the present invention, the driving circuit of the first embodiment for improving the low modulation frequency range characteristic of a laser includes means for narrowing the spectral line-width of oscillation wavelength of a laser by an electric feedback. When a period of oscillation wavelength fluctuation is longer than a predetermined value, a general feedback method for narrowing the spectral line-width cannot be applied because the above-discussed phase shift due to the effect of heat occurs. This embodiment can cope with such a problem. A driving system is shown in FIG. 12.

A light beam from a semiconductor DFB laser 601 is input into an optical frequency discriminator 610 to convert fluctuation of the wavelength of radiated light beam to fluctuation of a light intensity, and the fluctuation of the light intensity is converted to an electric signal by a photodetector 609. In this embodiment, a Fabry-Perot etalon, whose free spectral range and finesse are respectively 5 GHz and 50, is preferably used as the optical frequency discriminator 610. A GaAs pin photodiode is preferably employed as the photodetector 609. The electric signal so provided is superposed on injection current into the laser 601. The output of photodetector 609 is provided as an input to a power divider 608, in a similar manner as the modulation signal source 409 of the first embodiment, and the feedback control is performed. The feedback ratio can be adjusted by varying the gains of amplifiers 606 and 607 and the light power incident on the photodetector 609. In this case, the gains of the amplifiers 606 and 607 are respectively set to about 100 and 30, and an optimum feedback adjustment is achieved with light power in a range between about 10 $\mu$W and about 100 $\mu$W. Further, a long optical path length of the feedback system may limit the top of the high modulation frequency band, so the path length is restricted to about 10 cm and the frequency, at which a resonance occurs owing to a time delay of the feedback signal, is moved away to 3 GHz.

As a result, while the spectral line-width is around 15 MHz under non-feedback control condition, the spectral line-width can be narrowed to about 200 kHz, i.e. about a hundredth of 15 MHz, in this embodiment. This level is a practical level for making the laser usable as a light source of coherent optical communications.

In addition, when modulation current is further superposed, FSK transmissions can be conducted by using the driving system and method of the first or second embodiment.

Fourth Embodiment

Figure 13:
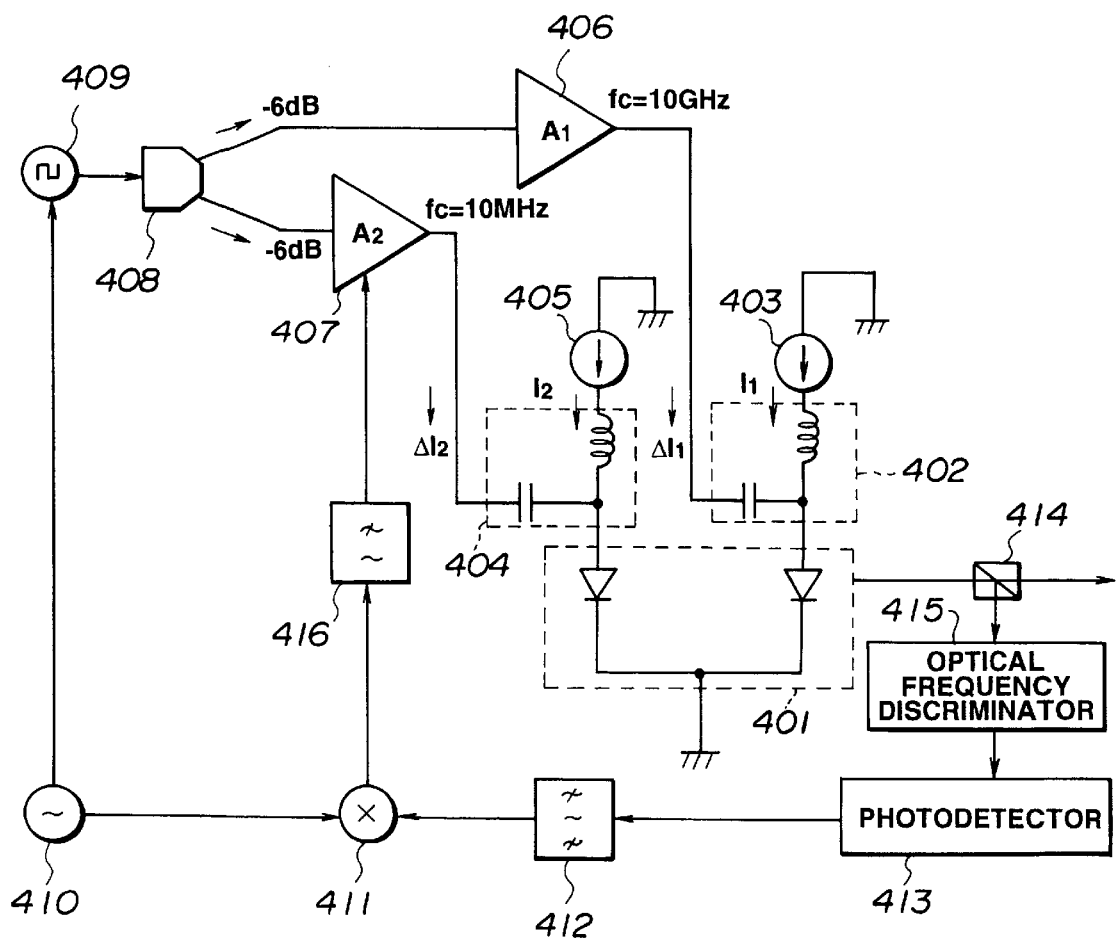
FIG. 13 is a schematic block diagram illustrating a driving circuit, according to a fourth embodiment of the present invention.
Figure 14:
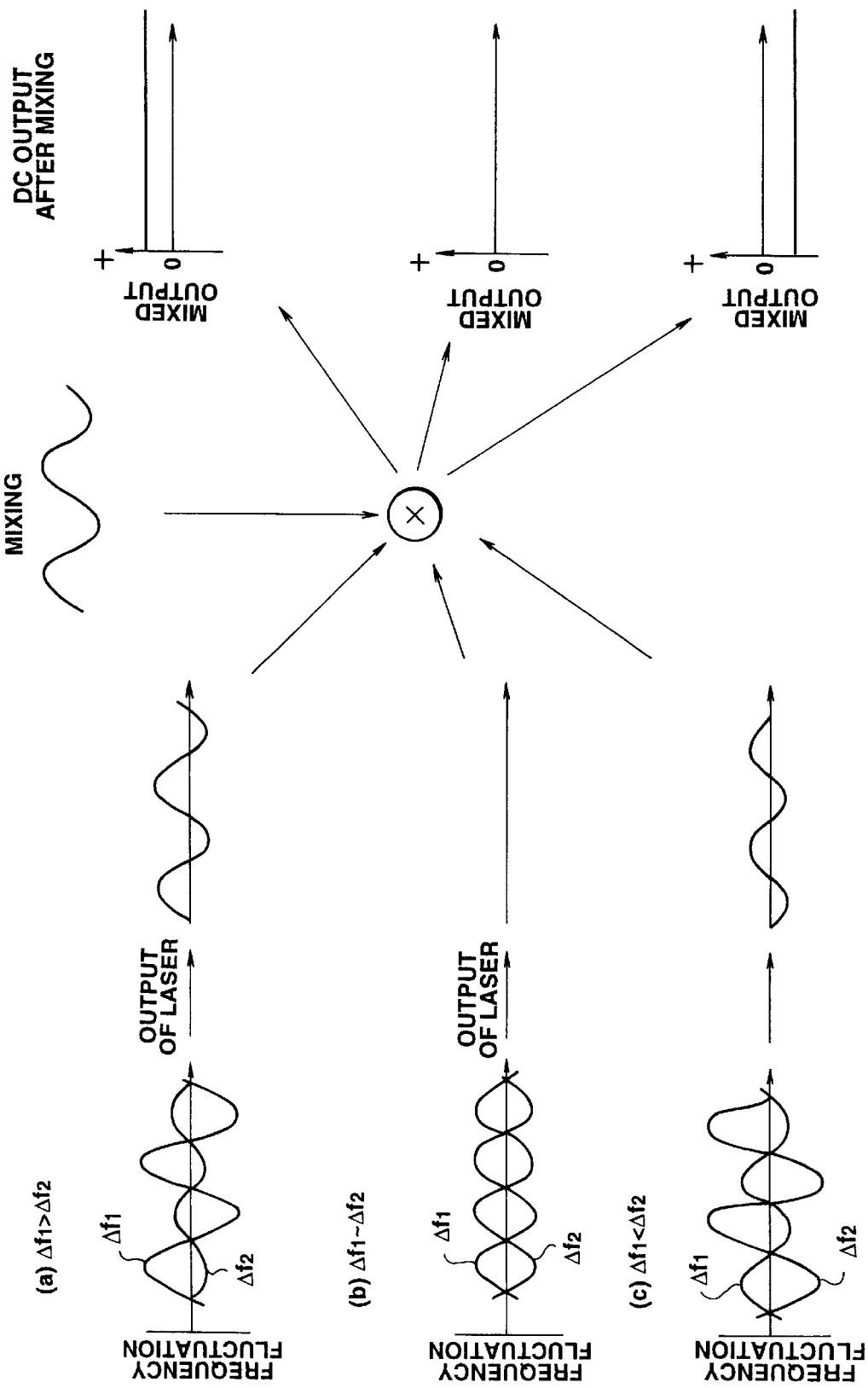
FIG. 14 is a view illustrating the principle of a driving method of the fourth embodiment of the present invention.

A fourth embodiment of the present invention will be described with reference to FIGS. 13 and 14. The fourth embodiment is different from the first embodiment in the following point. In FIG. 13, the same reference numerals as those in FIG. 9 designate the same members or devices.

The gain of amplifier 407 is made variable, and automatically adjusted to suppress the effect of heat in a low modulation frequency band range.

A sinusoidal wave oscillator 410 outputs two signals of approximately 5 kHz. One sinusoidal wave signal is input into a modulation electric source 409 and superposed on a modulation signal generated by the modulation electric source 409, and the other signal is mixed, by a balanced modulator 411, with a signal which is produced as follows: A portion of the output of a laser 401 is extracted by a beam splitter 414. The extracted light is transmitted through a frequency discriminator 415, such as preferably a Fabry-Perot etalon, and converted to an electric signal output by a photodetector 413. A signal component of about 5 kHz is picked out from the photodetector output signal by a band pass filter 412. The other oscillator signal is mixed, by the balanced modulator 411, with the approximately 5 kHz signal from the band pass filter 412.

A DC component of the mixed output from the balanced modulator 411 is selected out by a low pass filter 416, and provided as a gain control signal to amplifier 407 which is automatically gain controlled by this DC signal. This principle will be described with reference to FIG. 14.

When the laser 401 is modulated at intervals of 5 kHz, the frequency modulation occurs substantially only due to the effect of heat. Three cases exist depending on a difference in magnitude of the effect of heat at the two electrodes 109 of the laser 401. In the case where an oscillation frequency fluctuation $\Delta f_2$ caused by the effect of heat due to an injected current $\Delta I_2$ is smaller than an oscillation frequency fluctuation $\Delta f_1$ caused by the effect of heat due to an injected current $\Delta I_1$, as shown in a portion (a) of FIG. 14, the frequency fluctuation of output light is in-phase with $\Delta f_1$ or anti-phase with $\Delta I_1$. In the opposite case thereto where $\Delta f_1$ is less than $\Delta f_2$, as shown in a portion (c) of FIG. 14, the frequency fluctuation of output light is in-phase with $\Delta I_1$, or anti-phase with $\Delta f_1$. Further, in the case where the oscillation frequency fluctuation $\Delta f_2$ is substantially equal to the frequency fluctuation $\Delta f_1$ as shown in a portion (b) of FIG. 14, no output oscillation frequency fluctuation exists due to mutual elimination. If the frequency fluctuation is detected by a positive slope of the frequency discriminator's signal and its output is mixed with the sinusoidal wave signal, a positive DC output is obtained from balanced modulator 411, when the photodetector output is in-phase with the sinusoidal wave signal or anti-phase with $\Delta I_1$ which is provided by the inverting amplifier 406, as shown in the portion (a) of FIG. 14. Inversely, if the photodetector output is in an anti-phase with the sinusoidal wave signal as shown in the portion (c) of FIG. 14, a negative DC output is obtained from balanced modulator 411. If no frequency fluctuation exists as shown in the portion (b) of FIG. 14, the mixed output is zero. The case where the output is zero as shown in the portion (b) of FIG. 14 is an optimum point where the effect of heat at the two electrode regions eliminates each other. The deviation on either side from that optimum point is detected in the fourth embodiment, so that an automatic gain control of the amplifier 407 becomes possible. Therefore, the amplitude ratio between $\Delta I_1$ and $\Delta I_2$ can always be controlled automatically to be optimum.

When transmission is conducted, the sinusoidal wave component of 5 kHz, which is used for the above-discussed automatic gain control, is removed at the signal receiver side. In this embodiment, the frequency of the sinusoidal wave is preferably 5 kHz, which is chosen because its frequency value is low enough to cause frequency modulation solely due to the effect of heat and large enough to enable transmission through a bias T without attenuation due to a low cutoff frequency.

The principle of this embodiment will be summarized. In this embodiment, a low-frequency signal, for which the effect of heat is dominant, is superposed on each current injected into the laser. Thus, a feedback control is performed. Two electrodes are respectively modulated by low-frequency signals, such as sinusoidal wave signals of about 100 Hz, for which the effect of heat is dominant, with those signals having the same amplitude and being in an anti-phase with each other, a portion of output signal from the laser is picked out, only a component of about 100 Hz is selected by a band pass filter, and the selected component is combined with the sinusoidal wave signal of 100 Hz which modulates the laser. When its DC component is picked out by a low pass filter, a positive, zero or negative DC output can be obtained depending on the magnitude of modulation factor due to the effect of heat at regions of the two electrodes. The feedback control is performed based on that DC output, and the modulation current amplitude provided at one of the two electrodes is adjusted by an gain controlled amplifier or attenuator, operating in response to the DC signal.

Fifth Embodiment

Figure 15:
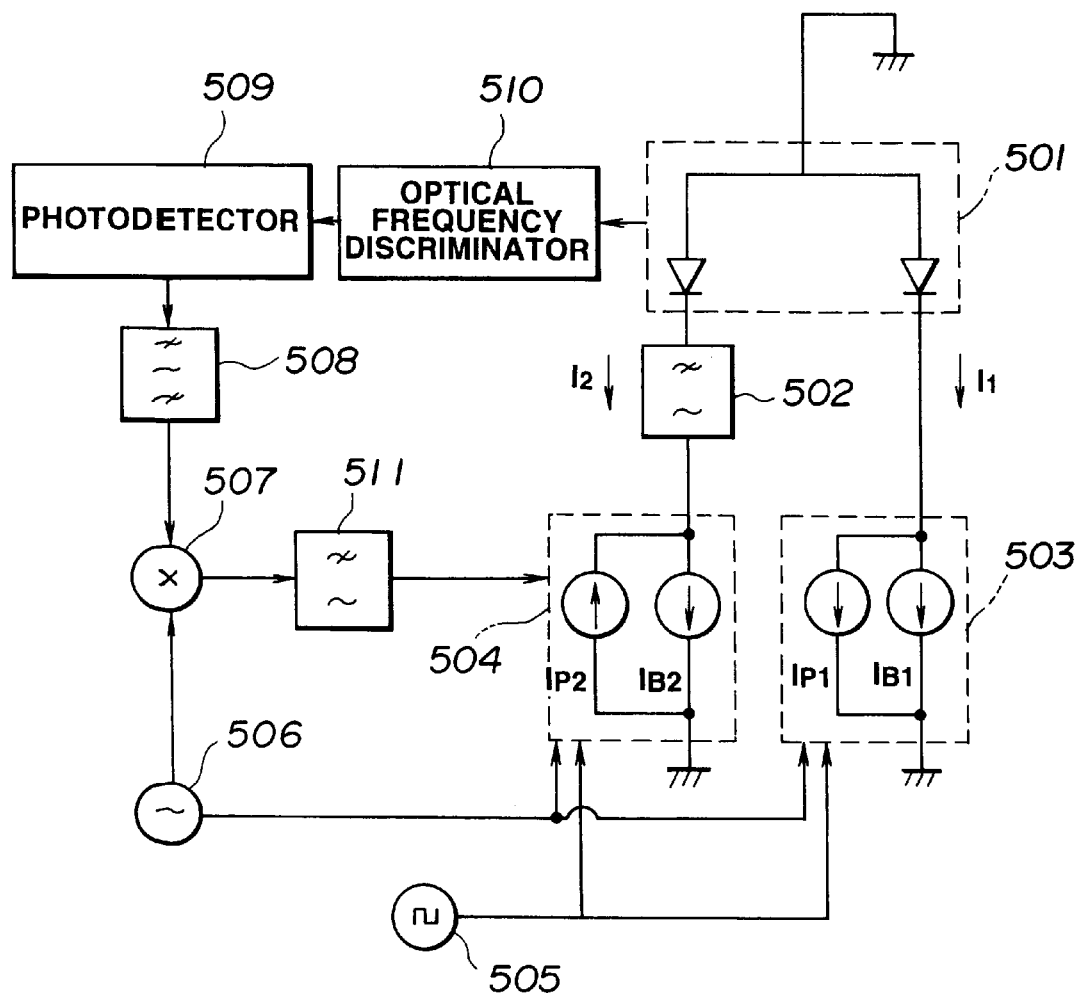
FIG. 15 is a schematic block diagram illustrating a driving circuit, according to a fifth embodiment of the present invention.

A fifth embodiment of the present invention will be described with reference to FIG. 15. The fifth embodiment is different from the second embodiment in the following point.

The current ratio between $\Delta I_1$ and $\Delta I_2$ is made variable, by adjusting the modulation current amplitude of driver IC 504, in the same manner as the fourth embodiment. In particular, the modulation current amplitude $I_p$ of the driver IC 504 is automatically controlled by a mixed output of a low pass filter 511 which is produced by the superposition of a sinusoidal wave signal of 100 Hz from a sinusoidal wave oscillator 506 and an output from a band pass filter 508 derived from a laser 501 in the same manner as the fourth embodiment. The frequency of the sinusoidal wave signal is preferably as low as possible to increase the continuity of NRZ signal. In this embodiment, this frequency is set at about 100 Hz because there is no limiting low-frequency cutoff due to a bias T such as was described in the fourth embodiment. In FIG. 15, reference numeral 507 designates a balanced modulator, reference numeral 509 designates a photodetector, and reference numeral 510 designates an optical frequency discriminator. The operation of this embodiment is substantially the same as that of the fourth embodiment.

Sixth Embodiment

Figure 16:
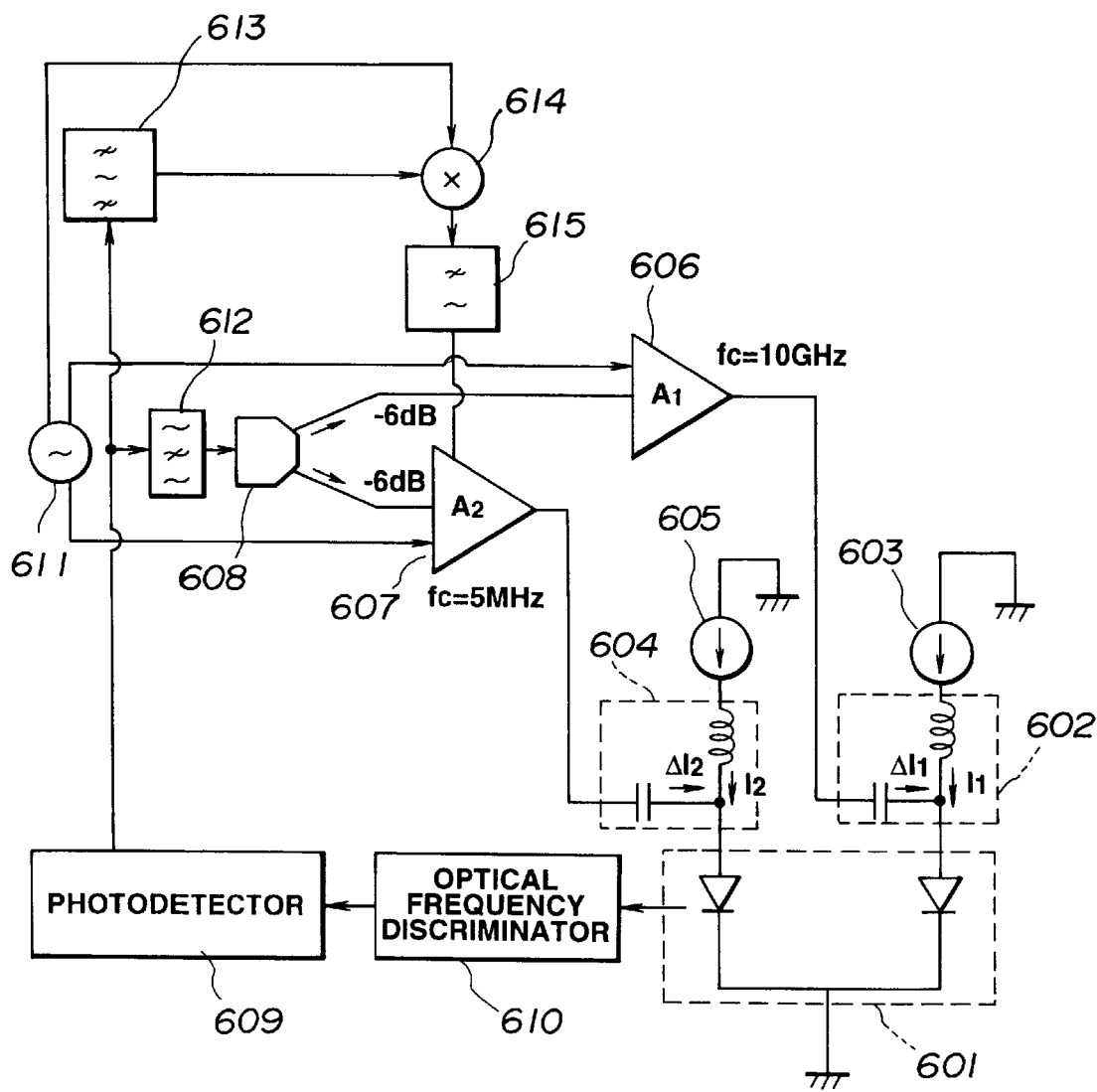
FIG. 16 is a schematic block diagram illustrating a driving circuit for narrowing spectral line-width according to a sixth embodiment of the present invention.

A sixth embodiment of the present invention will be described with reference to FIG. 16. The sixth embodiment is different from the third embodiment in the following point.

An electric signal detected by a photodetector 609 is input into a band elimination filter or trap circuit 612, whose output is superposed on the injection current into a laser 601 in a manner similar to the fourth embodiment to provide feedback control. The gain of the amplifier 607 is variable.

In this control system, the gain of amplifier 607 is rendered optimum by the antomatic control in the same manner as the fourth embodiment. A 5 kHz signal, from a sinusoidal wave oscillator 611 is input into each of amplifiers 606 and 607. The output of photodetector 609 is further input into a band pass filter 613, whose output is mixed with the sinusoidal wave provided by balanced modulator 614. The mixed signal is transmitted through a low pass filter 615, and provided as a gain control signal which automatically controls the gain of the amplifier 607 to cancel the effect of heat mentioned above. It is necessary to prevent the occurrence of oscillation which would be caused when a signal, that is produced from the fluctuation of oscillation wavelength due to the sinusoidal wave signal, would be fed back without any change. The band elimination filter 612 serves to remove that component of frequency (the sinusoidal wave oscillation frequency) which will cause the oscillation.

Seventh Embodiment

Figure 17:
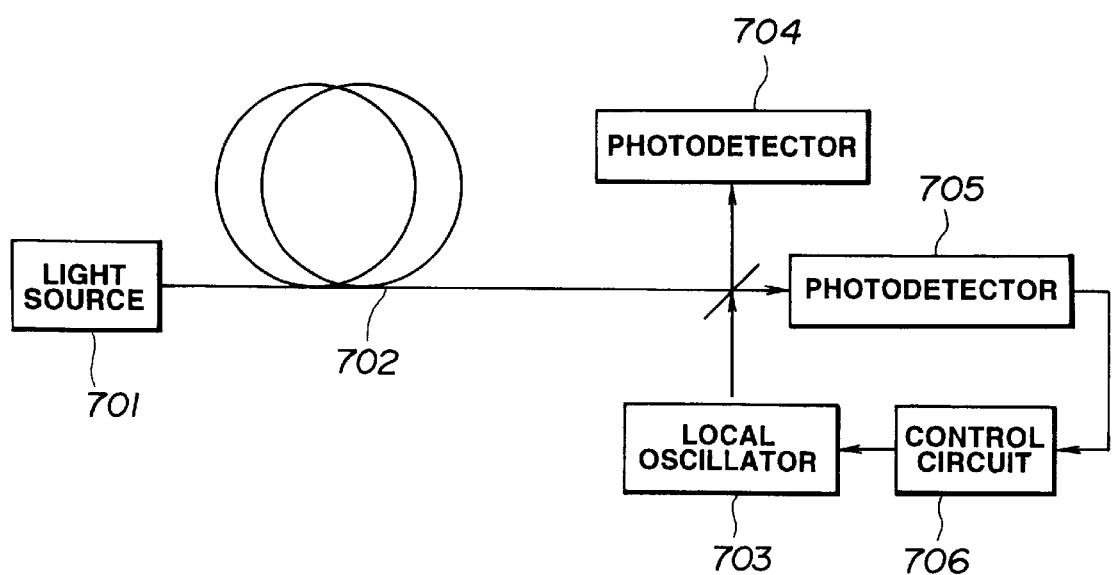
FIG. 17 is a block diagram illustrating a transmission system for performing coherent optical communication according to the present invention.

FIG. 17 shows a structure in which an optical transmission system is assembled including a light source which is driven by the above-discussed driving method of the first embodiment, the combination of first and third embodiments, the fourth embodiment, the combination of fourth and sixth embodiments or the like. A light beam emitted from a light source 701 is coupled to a single mode optical fiber 702 to be transmitted therethrough. On a receiver side, a laser 703 is provided as a local oscillator which emits an oscillating a light beam having the same wavelength as that of the light source 701, and an optical beat signal is generated by using the light beams from the both lasers 701 and 703. The beat signal is detected by a photodetector 705 using a delayed detection method. The oscillation wavelength of the laser 703 is stabilized by a conventional phase-locked loop (PLL) control circuit 706, using a signal created from the beat signal detected by a photodetector 705 as a control source.

Eighth Embodiment

Figure 18:
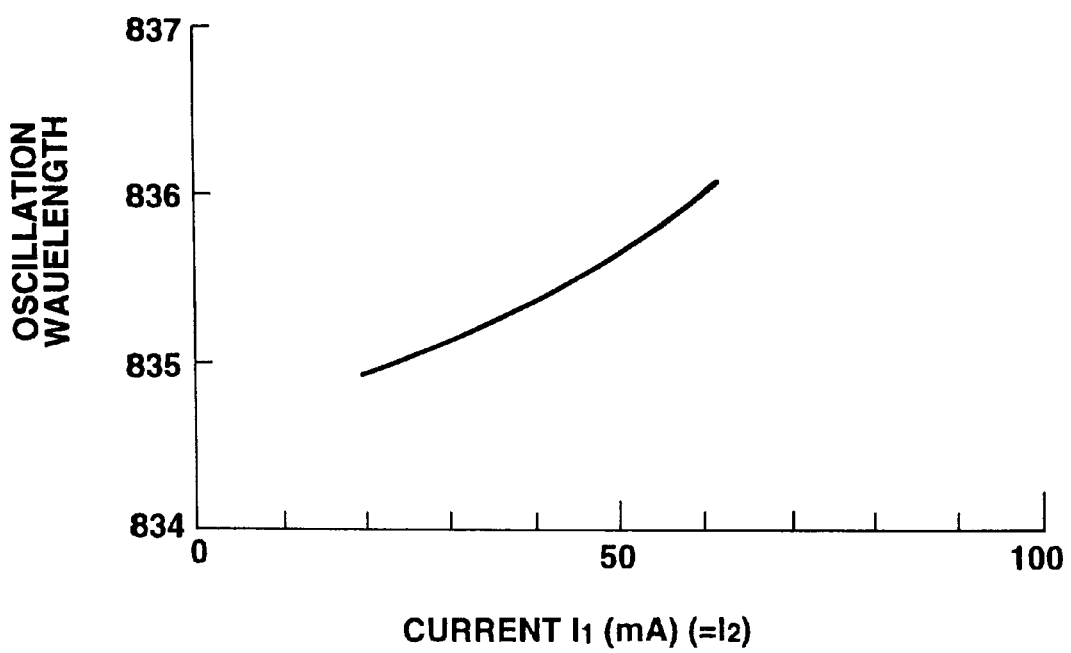
FIG. 18 is a graph illustrating a wavelength changeable characteristic of a distributed feedback semiconductor laser.

In an eighth embodiment of the present invention, the tunable characteristic or wavelength-changeable characteristic of a laser is utilized to perform wavelength or frequency division multiplexing transmissions. In the two-electrode DFB laser described in the first embodiment, the oscillation wavelength can be changed by controlling the magnitudes of current injected through the respective electrodes. The tunable characteristic is illustrated in FIG. 18. When the amounts of bias current injected through the respective electrodes are maintained to be equal to each other, i.e. $I_1=I_2$, and the current $I_1$ is changed from 20 mA to 60 mA, the oscillation wavelength can be continuously changed over a bandwidth of about 1 nm from 835 nm to 836 nm. In this embodiment, this property is utilized and a center of the oscillation wavelength spectrum is determined by controlling the bias current. Frequency modulation is conducted as described in the first embodiment or the like. The oscillation spectral line-width also may be narrowed as described in the third embodiment, the combination of first and third embodiments, the sixth embodiment, or the combination of fourth and sixth embodiments.

Figure 19:
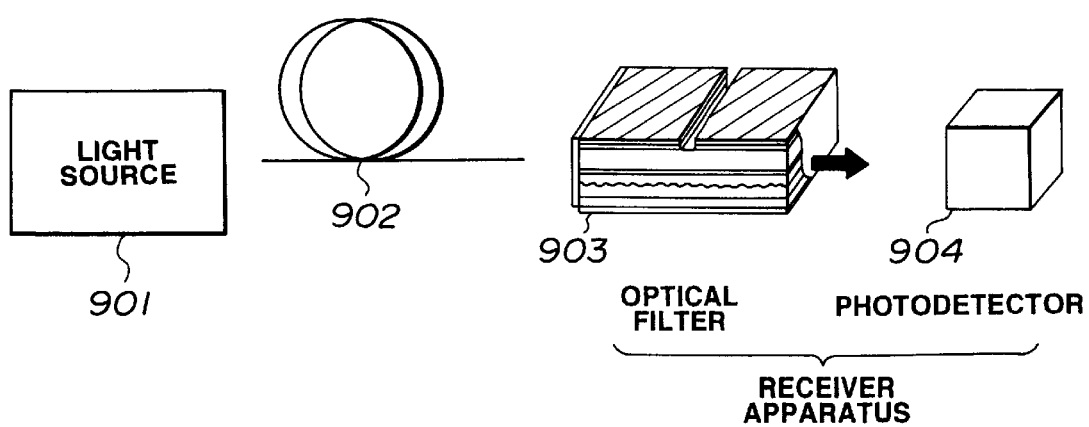
FIG. 19 is a block diagram illustrating a transmission system for performing wavelength division multiplexing transmission according to an eighth embodiment of the present invention.

Turning to FIG. 19, a method for performing wavelength division multiplexing communication by using the driving method of this embodiment is illustrated. In FIG. 19, reference numeral 901 is a light source for optical communications, which is modulated by FSK system using the present invention. In the light source 901, the oscillation wavelength can be changed in a range having a width of 1 nm as described above. In this embodiment, a frequency deviation amount of 5 GHz of FSK system can be obtained by setting the modulation current amplitude to about 8.3 mA. Therefore, when channels are arranged at intervals of about 10 GHz or 0.02 nm to perform the wavelength multiplexing, crosstalk among adajacent channels can be eliminated. Thus, when this light source apparatus is used, the wavelength or frequency multiplexing having about 1/0.02=50 channels is possible.

A light beam emitted from the light source 901 is coupled to a single mode optical fiber 902 to be transmitted therethrough. The signal light transmitted through the optical fiber 902 is received by a receiver apparatus. There, light of a desired wavelength is selectively demultiplexed by an optical filter 903, and the signal is detected by a photodetector 904. In this embodiment, a laser having the same structure as that of DFB laser of the first embodiment is used as the optical filter 903, and bias current having a magnitude below its threshold is injected thereinto. By changing the current ratio at the two electrodes of the optical fiber 903, the transmission wavelength can be varied by 1 nm while the transmission gained is maintained at 20 dB. The 10 dB-down transmission width of the filter 903 is approximately 10 GHz or 0.02 nm, and thus this filter 903 has sufficient bandwidth characteristic to attain the wavelength multiplexing having the intervals of 0.02 nm as descrived above.

Figure 20:
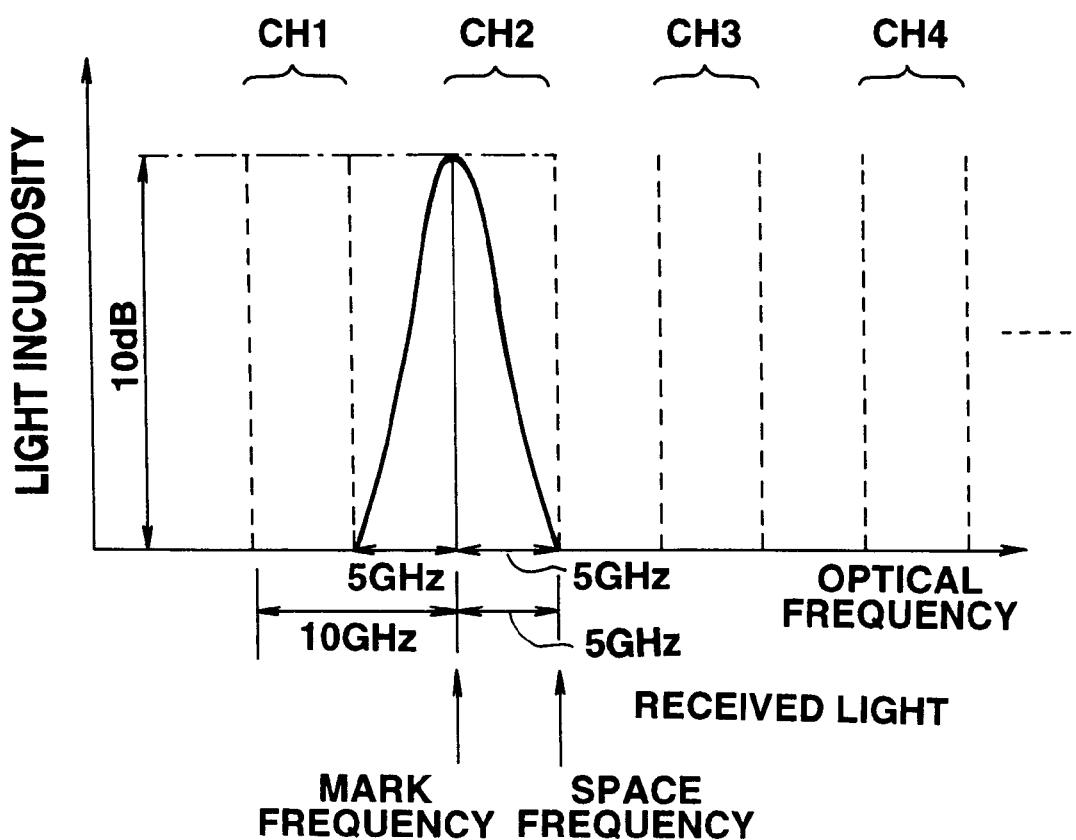
FIG. 20 is a transmission spectrum, illustrating wavelength multiplexed signals according to the present invention.

For detection of an FSK signal, the transmission characteristic of the filter 903 is utilized. As shown in FIG. 20, when the peak transmission wavelength of the filter 903 is tuned to a mark frequency (corresponding to a "1" of an FSK signal) of a desired channel, e.g. CH2, in the wavelength multiplexed signals, "1" and "0" can be detected at an extinction ratio of 10 dB after transmission through the filter 903 since a space frequency (corresponding to a "0" of an FSK signal) is remote from the mark frequency by the frequency deviation amount of 5 GHz as described above.

As an alternative to optical filter 903, other filters, such as a Mach-Zehnder type filter and a fiber Fabry-Perot type filter, may be used. Furthermore, in this embodiment, a single light source and a single receiver apparatus are preferred, but a plurality of light sources and a plurality of receiver apparatuses respectively connected by optical couplers or the like may be used for optical communications.

Alternatively, a receiver for wavelength multiplexed signals may be a coherent system as described in the seventh embodiment, other than the method of this embodiment.

In the foregoing, a laser of GaAs series is described, but equivalent materials such as InP series may be used.

Ninth Embodiment

Figure 21:
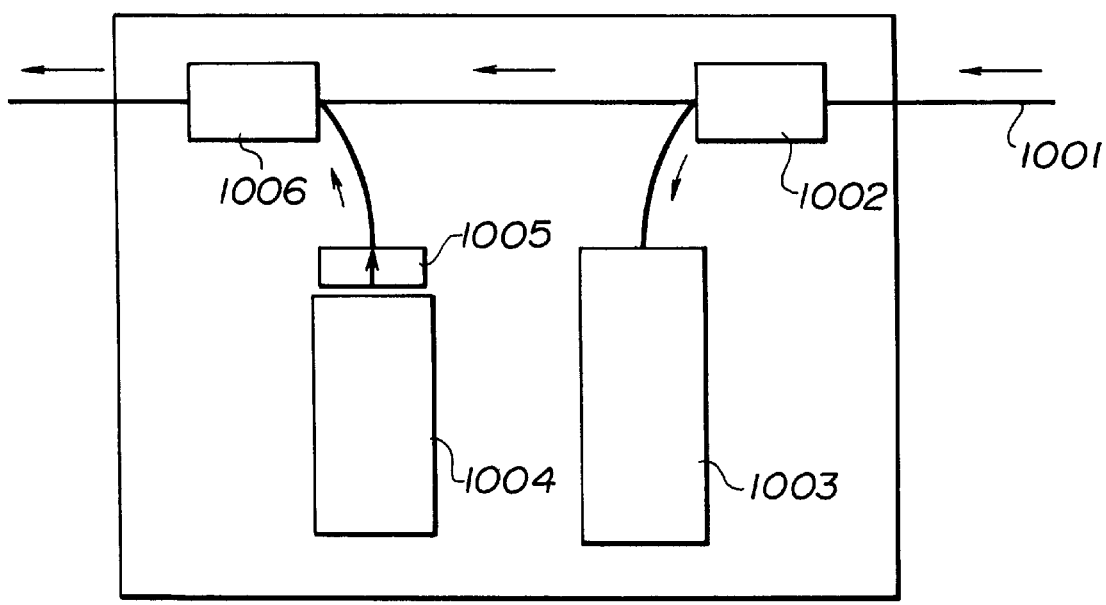
FIG. 21 is a view of a ninth embodiment of the present invention, showing an optical node.
Figure 22:
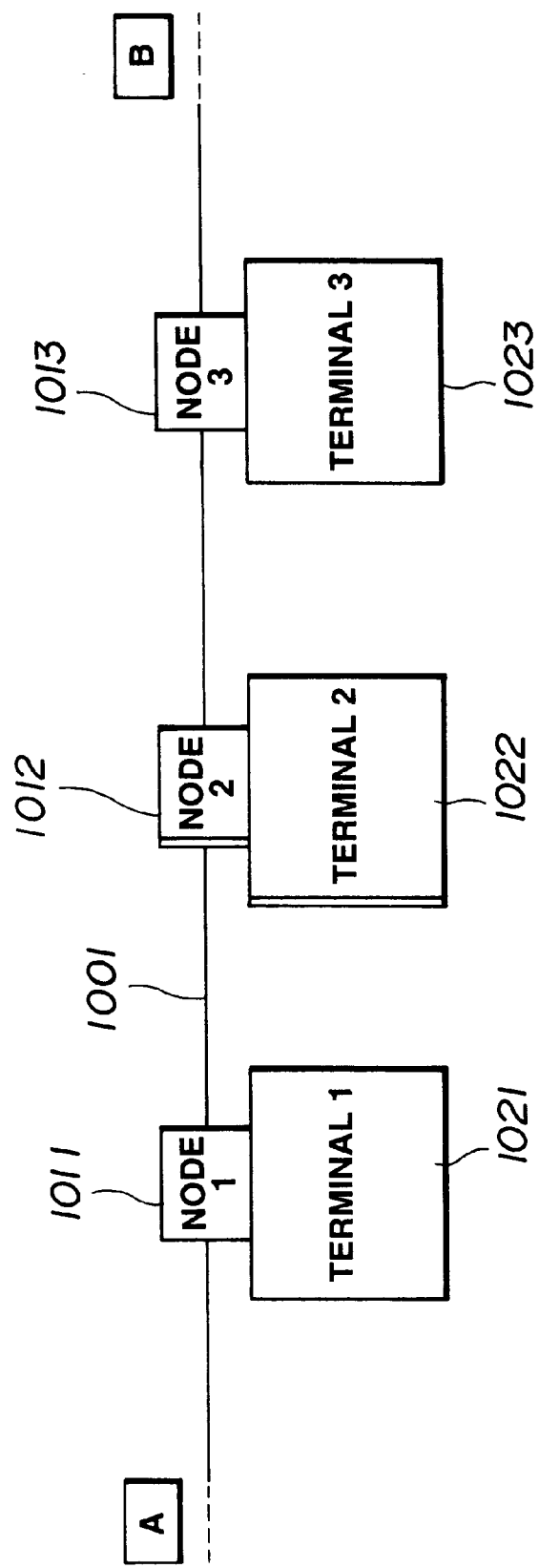
FIG. 22 is a block diagram of an optical local area network (LAN) according to the present invention.

FIG. 21 shows an opto-electric conversion unit (node) which is connected to each terminal when a driving method of a light source for optical communications of the present invention and an optical communication system using this driving method are applied to a wavelength or frequency division multiplexing optical LAN system. FIG. 22 shows an example of an optical LAN system in which the node is utilized.

An optical signal is taken into the node through an optical fiber 1001 externally connected thereto, and a portion of the signal is caused to enter a receiving device 1003 having a tunable filter such as filter 903 of FIG. 19, discussed above, through a branching device 1002. In this apparatus, only an optical signal at a desired wavelength is selected out by the above method, and the selected signal is detected. An alternative receiving method may use coherent system as discussed in reference with FIG. 17 above, and in this case a local oscillation laser is provided in place of the optical filter.

On the other hand, when an optical signal is transmitted from the node, light from a tunable DFB laser 1004, which is driven in accord with the invention and modulated in FSk system, is caused to enter the light transmission line 1001 through an isolator 1005 and a branching device 1006.

Further, a plurality of tunable DFB lasers and a plurality of tunable optical filters may respectively be arranged so that the changeable wavelength range can be widened.

The optical LAN system shown in FIG. 22 is a bus type network, and nodes 1011, 1012, 1013 are connected along A and B directions so that multiple terminals 1021, 1022, 1023 and centers, which constitute a network, can be provided. When multiple nodes are connected, it is necessary to serially connect an optical amplifier on the transmission line 1001 to compensate for attenuation of transmitted light. Further, two nodes may be connected to each terminal to build two transmission lines, so that a bidirectional transmission is possible by DQDB system or the like.

In such an optical network system, using the driving method of the present invention, a high-density wavelength or frequency division multiplexing transmission network, which has a wavelength multiplicity of 50, can be constructed as described above.

Furthermore, a loop type network can be constructed by connecting A and B in FIG. 22, and a star type network and a compound-configuration type network may be established.

Tenth Embodiment

Figure 23:
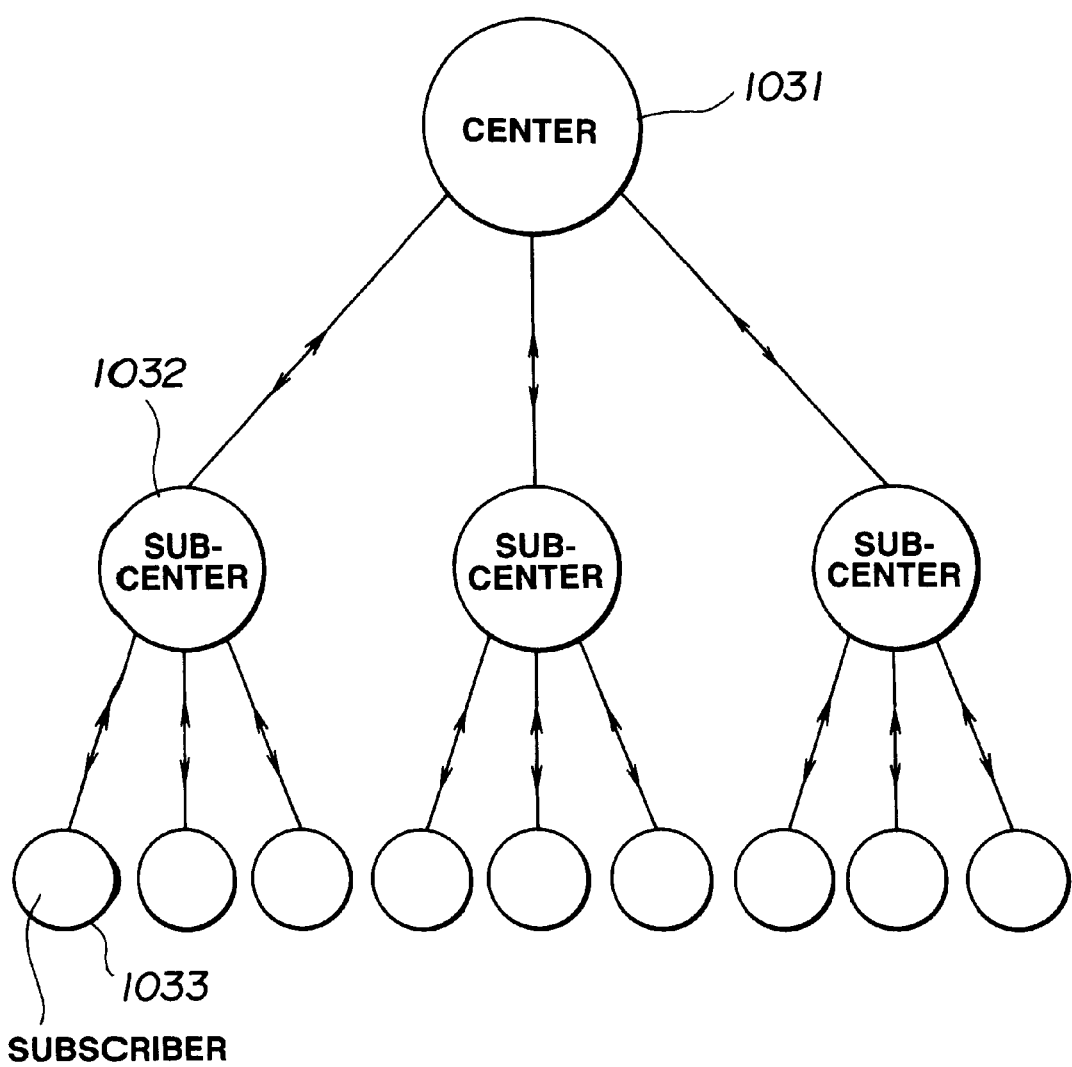
FIG. 23 is a block diagram of an optical cable television (CATV) system according to the present invention.

An optical CATV, as shown in FIG. 23, can be constructed using the apparatus and optical communication system of the present invention. In a CATV center 1031 or sub-center 1032, a tunable laser is modulated in accord with the invention as described above, and a wavelength multiplexing light source is constructed also in accord with the invention. On the side of a subscriber 1033 who is a receiver, a receiver apparatus having a tunable filter such as described in connection with FIG. 19, is used.

Conventionally, it is difficult to use a DFB filter in such a system due to influences of dynamic fluctuation of oscillation wavelength, but it becomes possible according to the present invention.

Further, a bidirectional CATV is possible in the following manner. The subscriber 1033 has an external modulator (an example of simple bidirectional optical CATV, see, for example, Ishikawa and Furuta "LiNbO$_3$ Optical Wavelength Modulator For Bi-directional Transmission in Optical CATV Subscriber Systems", OCS 91-82 1991), and a signal from the subscriber 1033 is received as a reflected light (reflected light of a signal light transmitted to the subscriber 1033) from its external modulator. Thus, a star type network as shown in FIG. 23 is constructed, and highly improved functions of services can be obtained.

According to the present invention, a modulation frequency band range on a low-frequency side can be greatly expanded when a semiconductor laser is frequency-modulated, and hence a high-speed transmission becomes possible. In particular cases, this can be achieved irrespective of changes in laser's packaging configuration, environment and the like.

Furthermore, a band range can be widened when an oscillation spectral line-width is narrowed by an electric feedback method, so that a spectral line width, which is narrower than that of a conventional one, can readily be attained. Thus, a light source, which is suitable for a coherent optical communication, can be provided, for example.

Except as otherwise disclosed herein, the various components shown in outline or block form in the FIGS. are individually well known in the optical semiconductor device, its driving method and optical communication arts, and their internal construction and operation are not critical either to the making or using of this invention or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the sprit and scope of the appended claims.

What is claimed is:

1. A driving method for frequency-modulating a semiconductor laser by directly injecting modulation current having a modulation frequency into the semiconductor laser, said semiconductor laser being provided with at least first and second electrodes through each of which current is injected, said driving method comprising the steps of:

injecting a first modulation current through the first electrode when the modulation frequency is in a first frequency band; and when the modulation frequency is in a second frequency band lower than the first frequency band, injecting the first modulation current through the first electrode and injecting a second modulation current, which is anti-phase with the first modulation current injected through the first electrode, through the second electrode, and when the modulation frequency is in the first frequency band, the second modulation current which is anti-phase with the first modulation current is not injected through said second electrode.

2. A driving method according to claim 1, wherein the second frequency band comprises frequencies less than approximately 10 MHz.

3. A driving method according to claim 1, wherein the modulation amplitude of the second modulation current injected through the second electrode is adjusted such that no phase difference is created between the first modulation current injected through the first electrode and an optical frequency modulation signal emitted from the semiconductor laser.

4. A driving method according to claim 1, further comprising a step of feedback-controlling a ratio between amplitudes of the first modulation current and the second modulation current based on a light output from the semiconductor laser.

5. A driving method according to claim 4, wherein said feedback-controlling is performed such that a phase difference between the first modulation current injected through the first electrode and an optical frequency modulation signal emitted from the semiconductor laser is maintained at a substantially constant magnitude over a wide modulation band.

6. A driving method according to claim 4, wherein said feedback-controlling is performed by superposing a sinusoidal wave signal, whose frequency is lower than the modulation frequency, on both the first modulation current and the second modulation current, converting fluctuation of an optical frequency modulation signal emitted from the semiconductor laser, which is caused by the sinusoidal wave signal, to fluctuation of light intensity, detecting the fluctuation of light intensity, multiplying the detected fluctuation of light intensity by the sinusoidal wave signal to supply a multiplication signal, selecting out a low-frequency component, whose frequency is lower than the frequency of the sinusoidal wave signal, from the multiplication signal, and controlling the amplitude of at least one of the first modulation current and the second modulation current based on the selected-out low-frequency component.

7. A driving method according to claim 1, wherein the semiconductor laser has active regions in a region into which current is injected by the first electrode and in a region into which current is injected by the second electrode.

8. A driving apparatus for frequency-modulating a semiconductor laser by directly injecting modulation current into the semiconductor laser, said semiconductor laser being provided with at least first and second electrodes through each of which current is injected, said driving apparatus comprising:

said signal generating means for generating two signals each of which includes at least a modulation signal;

a first amplifier whose cutoff frequency is more than several GHz, said first amplifier receiving one of the two signals to supply a first output;

first injection means for cutting a DC-component of the first output and superposing the thus cut first output on a first bias current and for injecting the superposed current into the semiconductor laser through the first electrode;

a second amplifier having a cutoff frequency lower than the cutoff frequency of said first amplifier, said second amplifier receiving the other of the two signals to supply a second output which is anti-phase with the first output; and second injection means for cutting a DC-component of the second output and superposing the thus cut second output on a second bias current and for injecting the superposed current into the semiconductor laser through the second electrode.

9. A driving apparatus according to claim 8, wherein the cutoff frequency of said second amplifier is approximately 10 MHz.

10. A driving apparatus according to claim 8, wherein one of said first and second amplifiers comprises an inverting type amplifier and where the other comprises a non-inverting type amplifier.

11. A driving apparatus according to claim 8, wherein said signal generating means includes a modulation electric source for supplying a modulation signal and dividing means for dividing the modulation signal into two signals.

12. A driving apparatus according to claim 11, wherein a ratio between amplitudes of at least the modulation signals of the first and second outputs can be adjusted by changing a ratio between gains of said first and second amplifiers.

13. A driving apparatus according to claim 8, wherein said signal generating means comprises means for generating two signals, each of which includes a modulation signal and a sinusoidal wave signal which is superposed on the modulation signal and whose frequency is lower than the frequency of the modulation signal.

14. A driving apparatus according to claim 13, further comprising:

picking-out means for picking out a portion of a light output of the semiconductor laser;

an optical frequency discriminator for converting fluctuation of optical frequency of the light output of the semiconductor laser to fluctuation of light intensity to supply a fluctuation output;

a photodetector for detecting the fluctuation output from said optical frequency discriminator to supply an electric signal;

a band pass filter for selecting out a frequency component, whose frequency is substantially the same as the frequency of the sinusoidal wave signal, from the electric signal from said photodetector;

multiplying means for multiplying the sinusoidal wave signal by the component of the electric signal selected out by said band pass filter to supply a multiplication electric signal;

a low pass filter for picking out a component, whose frequency is lower than the frequency of the sinusoidal wave signal, from the multiplication electric signal; and adjusting means for adjusting a ratio between gains of said first and second amplifiers based on the component picked out by said low pass filter.

15. A driving apparatus according to claim 8, wherein the semiconductor laser has active regions in a region into which current is injected by the first electrode and in a region into which current is injected by the second electrode.

16. A driving apparatus for frequency-modulating a semiconductor laser by directly injecting modulation current into the semiconductor laser, said semiconductor laser being provided with at least first and second electrodes through each of which current is injected, said driving apparatus comprising:

signal generating means for generating two signals each of which includes at least a modulation signal;

a first voltage-current converter for supplying an anti-phase output, said first voltage-current converter injecting one of the two signals combined with a first bias current into the semiconductor laser through the first electrode, as the anti-phase output;

a second voltage-current converter for supplying an in-phase output, said second voltage-current converter injecting the other of the two signals combined with a second bias current into the semiconductor laser through the second electrode, as the in-phase output; and a first low pass filter, said low pass filter being disposed between one of said first and second voltage-current converters and the semiconductor laser.

17. A driving apparatus according to claim 16, wherein the cutoff frequency of said first low pass filter is approximately 10 MHz.

18. A driving apparatus according to claim 16, wherein said signal generating means includes a modulation electric source for supplying a modulation signal and dividing means for dividing the modulation signal into two signals.

19. A driving apparatus according to claim 18, wherein a ratio between modulation amplitudes of the anti-phase and in-phase outputs can be adjusted by changing a ratio between gains of said first and second voltage-current converters.

20. A driving apparatus according to claim 16, wherein said signal generating means comprises means for generating two signals, each of which includes a modulation signal and a sinusoidal wave signal which is superposed on the modulation signal and whose frequency is lower than the frequency of the modulation signal.

21. A driving apparatus according to claim 20, further comprising:

picking-out means for picking out a portion of light output of the semiconductor laser;

an optical frequency discriminator for converting fluctuation of optical frequency of the light output of the semiconductor laser to fluctuation of light intensity to supply a fluctuation output;

a photodetector for detecting the fluctuation output from said optical frequency discriminator to supply an electric signal;

a band pass filter for selecting out a component, whose frequency is substantially the same as the frequency of the sinusoidal wave signal, from the electric signal from said photodetector;

multiplying means for multiplying the sinusoidal wave signal by the component of the electric signal selected out by said band pass filter to supply a multiplication electric signal;

a second low pass filter for picking out a component, whose frequency is lower than the frequency of the sinusoidal wave signal, from the multiplication electric signal; and adjusting means for adjusting a ratio between gains of said first and second voltage-current converters based on the component picked out by said second low pass filter.

22. A driving apparatus according to claim 16, wherein the semiconductor laser has active regions in a region into which current is injected by the first electrode and in a region into which current is injected by the second electrode.

23. A driving method for narrowing a spectral line width of a semiconductor laser which is provided with at least first and second electrodes through each of which current is injected, said driving method comprising the steps of:

producing an electric signal characterized by a frequency, by detecting fluctuation of oscillation wavelength of a light output from the semiconductor laser;

injecting negative feedback current produced from the electric signal, through the first electrode, and not injecting a current which is anti-phase with the negative feedback current through the second electrode, when the frequency of the electric signal is in a first frequency band; and injecting negative feedback current produced from the electric signal, through the first electrode, while injecting anti-phase current, which is anti-phase with the negative feedback current produced from the electric signal, through the second electrode when the frequency of the electric signal is in a second frequency band which is lower than the first frequency band.

24. A driving method according to claim 23, wherein the second frequency band comprises frequencies less than approximately 10 MHz.

25. A driving method according to claim 23, wherein the amplitude of the anti-phase current injected through the second electrode is adjusted such that no phase difference is created between the negative feedback current injected through the first electrode and the fluctuation of oscillation wavelength of the light output emitted from the semiconductor laser, the fluctuation being caused by the negative feedback current and the anti-phase current injected into the semiconductor laser.

26. A driving method according to claim 23, further comprising a step of feedback-controlling a ratio between amplitudes of the negative feedback current and the anti-phase current based on the light output from the semiconductor laser.

27. A driving method according to claim 26, wherein said feedback-controlling is performed such that a phase difference between the negative feedback current injected through the first electrode and the fluctuation of oscillation wavelength of the light output emitted from the semiconductor laser is maintained at a substantially constant magnitude over a wide band, the fluctuation being caused by the negative feedback current and the anti-phase current injected into the semiconductor laser.

28. A driving method according to claim 26, wherein said feedback-controlling is performed by superposing a sinusoidal wave signal, whose frequency is lower than the frequency of the negative feedback current, on both of the negative feedback current and the anti-phase current, converting the fluctuation of oscillation wavelength of the output light emitted from the semiconductor laser, which is caused by the sinusoidal wave signal, to fluctuation of light intensity, detecting the fluctuation of light intensity, multiplying the detected fluctuation of light intensity by the sinusoidal wave signal to supply a multiplication signal, selecting out a low-frequency component, whose frequency is lower than the frequency of the sinusoidal wave signal, from the multiplication signal, and controlling a ratio between amplitudes of the negative feedback current and the anti-phase current based on the selected-out low-frequency component.

29. A driving method according to claim 23, wherein the semiconductor laser has active regions in a region into which current is injected by the first electrode and in a region into which current is injected by the second electrode.

30. A driving apparatus for narrowing an oscillation spectral line width of a semiconductor laser which is provided with at least first and second electrodes through each of which current is injected, said driving apparatus comprising:

signal generating means for generating two signals;

a first amplifier whose cutoff frequency is more than several GHz, said first amplifier receiving one of the two signals to supply a first output, the first output having a first modulation amplitude;

first injection means for cutting a DC-component of the first output and superposing the thus cut first output on a first bias current and for injecting the superposed current into the semiconductor laser through the first electrode;

a second amplifier whose cutoff frequency is lower than the cutoff frequency of said first amplifier, said second amplifier receiving the other of the two signals to supply a second output which is anti-phase with the first output, the second output having a second modulation amplitude; and second injection means for cutting a DC-component of the second output and superposing the thus cut second output on a second bias current and for injecting the superposed current into the semiconductor laser through the second electrode.

31. A driving apparatus according to claim 30, wherein the cutoff frequency of said second amplifier is approximately 10 MHz.

32. A driving apparatus according to claim 30, wherein one of said first and second amplifiers comprises an inverting type amplifier and where the other comprises a non-inverting type amplifier.

33. A driving apparatus according to claim 30, wherein said signal generating means includes picking-out means for picking out a portion of a light output from the semiconductor laser, a frequency discriminator for detecting fluctuation of oscillation wavelength of the light output from the semiconductor laser, a photodetector for detecting light transmitted through said frequency discriminator to supply a signal, and dividing means for dividing the signal supplied by said photodetector into two signals.

34. A driving apparatus according to claim 33, wherein a ratio between modulation amplitudes of the first and second outputs can be adjusted by changing a ratio between gains of said first and second amplifiers.

35. A driving apparatus according to claim 30, wherein said signal generating means comprises means for generating two sinusoidal wave signals which are in-phase with each other.

36. A driving apparatus according to claim 35, further comprising:

picking-out means for picking out a portion of a light output of the semiconductor laser;

a frequency discriminator for detecting fluctuation of oscillation wavelength of the light output from the semiconductor laser;

a photodetector for detecting light transmitted through said frequency discriminator to supply a signal;

superposing means for superposing signals, which are produced by removing a component of frequency of the sinusoidal wave signal from the signal from said photodetector, on the two sinusoidal wave signals, respectively, to supply respective superposed signals into said first and second amplifiers, respectively;

a band pass filter for selecting out a component, whose frequency is close to the frequency of the sinusoidal wave signal, from the signal from said photodetector;

multiplying means for multiplying the sinusoidal wave signal by the component of the signal selected out by said band pass filter to supply a multiplication electric signal;

a low pass filter for picking out a component, whose frequency is lower than the frequency of the sinusoidal wave signal, from the multiplication electric signal; and adjusting means for adjusting a ratio between gains of said first and second amplifiers based on the component picked out by said low pass filter.

37. A driving apparatus according to claim 30, wherein the semiconductor laser has active regions in a region into which current is injected by the first electrode and in a region into which current is injected by the second electrode.

38. A driving apparatus for narrowing an oscillation spectral line width of a semiconductor laser which is provided with at least first and second electrodes through each of which current is injected, said driving apparatus comprising:

signal generating means for generating two signals each characterized by a modulation amplitude;

a first voltage-current converter for supplying an anti-phase output, said first voltage-current converter injecting one of the two signals combined with a first bias current into the semiconductor laser through the first electrode, as the anti-phase output;

a second voltage-current converter for supplying an in-phase output, said second voltage-current converter injecting the other of the two signals combined with a second bias current into the semiconductor through the second electrode, as the in-phase output; and a first low pass filter, said low pass filter being disposed between one of said first and second voltage-current converters and the semiconductor laser.

39. A driving apparatus according to claim 38, wherein the cutoff frequency of said first low pass filter is approximately 10 MHz.

40. A driving apparatus according to claim 38, wherein said signal generating means includes picking-out means for picking out a portion of a light output from the semiconductor laser, a frequency discriminator for detecting fluctuation of oscillation wavelength of the light output from the semiconductor laser, a photodetector for detecting light transmitted through said frequency discriminator to supply a signal, and dividing means for dividing the signal supplied by said photodetector into two signals.

41. A driving apparatus according to claim 40, wherein a ratio between modulation amplitudes of the anti-phase and in-phase outputs can be adjusted by changing a ratio between gains of said first and second voltage-current converters.

42. A driving apparatus according to claim 38, wherein said signal generating means comprises means for generating two sinusoidal wave signals which are in-phase with each other.

43. A driving apparatus according to claim 42, further comprising:

picking-out means for picking out a portion of a light output of the semiconductor laser;

a frequency discriminator for detecting fluctuation of oscillation wavelength of the light output from the semiconductor laser;

a photodetector for detecting light transmitted through said frequency discriminator to supply a signal;

superposing means for superposing signals, which are produced by removing a component of frequency of the sinusoidal wave signal from the signal from said photodetector, on the two sinusoidal wave signals, respectively, to supply respective superposed signals into said first and second voltage-current converters, respectively;

a band pass filter for selecting out a component, whose frequency is substantially the same as the frequency of the sinusoidal wave signal, from the signal from said photodetector;

multiplying means for multiplying the sinusoidal wave signal by the component of the signal selected out by said band pass filter to supply a multiplication electric signal;

a second low pass filter for picking out a component, whose frequency is lower than the frequency of the sinusoidal wave signal, from the multiplication electric signal; and adjusting means for adjusting a ratio between gains of said first and second voltage-current converter based on the component picked out by said second low pass filter.

44. A driving apparatus according to claim 38, wherein the semiconductor laser has active regions in a region into which current is injected by the first electrode and in a region into which current is injected by the second electrode.

45. A driving method for driving a semiconductor laser which is provided with at least first and second electrodes through each of which current is injected into the semiconductor laser, said driving method comprising the steps of:

injecting a first current, whose frequency is varied, through the first electrode when the frequency of the current is in a first frequency band; and injecting the first current through the first electrode while injecting phase-shifted current, whose phase is shifted relative to the first current, through the second electrode when the frequency of the first current is in a second frequency band which is lower than the first frequency band;

wherein when the frequency of the first current is in the first frequency band, the phase-shifted current is not injected through the second electrode.

46. A driving method according to claim 45, wherein the phase-shifted current is anti-phase with the first current.

47. A driving method according to claim 45, wherein the second frequency band comprises frequencies less than approximately 10 MHz.

48. A driving method according to claim 45, wherein the first current includes at least modulation current modulated according to a predetermined signal.

49. A driving method according to claim 48, wherein the modulation amplitude of the phase-shifted current injected through the second electrode is adjusted such that no phase difference is created between the modulation current injected through the first electrode and an optical frequency modulation signal emitted from the semiconductor laser.

50. A driving method according to claim 48, further comprising a step of feedback-controlling a ratio between amplitudes of the modulation current and the phase-shifted current based on a light output from the semiconductor laser.

51. A driving method according to claim 45, wherein the first current includes at least negative feedback current produced by an electric signal obtained by detecting fluctuation of oscillation wavelength of a light output from the semiconductor laser.

52. A driving method according to claim 51, wherein the amplitude of the phase-shifted current injected through the second electrode is adjusted such that no phase difference is created between the negative feedback current injected through the first electrode and the fluctuation of oscillation wavelength of the light output of the semiconductor laser, the fluctuation being caused by the negative feedback current and the phase-shifted current injected into the semiconductor laser.

53. A driving method according to claim 51, further comprising a step of feedback-controlling a ratio between amplitudes of the negative feedback current and the phase-shifted current based on the light output from the semiconductor laser.

54. A driving method according to claim 45, wherein the semiconductor laser has active regions in a region into which current is injected by the first electrode and in a region into which current is injected by the second electrode.

55. A driving method for driving a semiconductor laser which is provided with at least first and second electrodes through each of which current is injected into the semiconductor laser, said driving method comprising steps of:

injecting frequency varying current through the first electrode when the frequency of the varying current is in a high frequency band, the varying current including modulation current to frequency-modulate the semiconductor laser and negative feedback current produced by an electric signal obtained by detecting fluctuation of oscillation wavelength of a light output from the semiconductor laser; and injecting varying current through the first electrode while injecting phase-shifted current, whose phase is shifted relative to the varying current, through the second electrode when the frequency of the varying current is in a low frequency band which is lower than the frequency of the high frequency band, the phase-shifted current including modulation current phase-shifted relative to the modulation current included in the varying current and the modulation amplitude of at least one of the modulation currents being adjusted to frequency-modulate the semiconductor laser, wherein when the frequency of the varying current is in the high frequency band, the phase-shifted current is not injected through the second electrode.

56. A driving method according to claim 55, wherein the frequency modulation is frequency shift keying in which digital signals perform the frequency modulation.

57. A driving apparatus according to claim 55, wherein the semiconductor laser has active regions in a region into which current is injected by the first electrode and in a region into which current is injected by the second electrode.

58. A driving method for driving a semiconductor laser which is provided with at least first and second electrodes through each of which current is injected into the semiconductor laser, said driving method comprising steps of:

injecting varying current through the first electrode when the frequency of the varying current is in a high frequency band, the varying current including modulation current to frequency-modulate the semiconductor laser;

injecting varying current through the first electrode while injecting phase-shifted current, whose phase is shifted relative to the varying current, through the second electrode when the frequency of the varying current is in a low frequency band which is lower than the frequency of the high frequency band, the phase-shifted current including modulation current phase-shifted relative to the modulation current included in the varying current; and feedback-controlling a ratio between amplitudes of the varying current and the phase-shifted current based on the light output from the semiconductor laser, wherein when the frequency of the varying current is in the high frequency band, the phase-shifted current is not infected through the second electrode.

59. A driving method according to claim 58, wherein the varying current further includes negative feedback current produced by an electric signal obtained by detecting fluctuation of oscillation wavelength of a light output from the semiconductor laser.

60. A driving method according to claim 58, wherein the frequency modulation is frequency shift keying in which digital signals perform the frequency modulation.

61. A driving method according to claim 58, wherein the semiconductor laser has active regions in a region into which current is injected by the first electrode and in a region into which current is injected by the second electrode.

62. A driving apparatus for frequency-modulating a semiconductor laser by directly injecting modulation current having a modulation frequency into the semiconductor laser, said semiconductor laser being provided with at least first and second electrodes through each of which current is injected, said driving apparatus comprising:

control means for controlling injection of modulation current into said first and second electrodes, wherein said control means controls modulation current injected into said first and second electrodes in accordance with whether said modulation frequency is in a first frequency band or a second frequency band which is lower than the first frequency band, and when said modulation current is in the first frequency band, the first modulation current is injected through said first electrode, and when the modulation current is in the second frequency band, the first modulation current is injected through said first electrode and the second modulation current which is anti-phase with the first modulation current is injected through said second electrode.

63. A driving apparatus according to claim 62, wherein the semiconductor laser has active regions in a region into which current is injected by the first electrode and in a region into which current is injected by the second electrode.

64. A driving apparatus for narrowing a spectral line width of a semiconductor laser which is provided with at least first and second electrodes through each of which current is injected, said driving apparatus comprising:

producing means for producing an electric signal characterized by a frequency, by detecting fluctuation of oscillation wavelength of a light output from the semiconductor laser; and control means for controlling injection of current into said first and second electrodes, wherein said control means controls current injected into said first and second electrodes in accordance with whether the frequency of the electric signal is in a first frequency band or a second frequency band which is lower than the first frequency band, and when the frequency of the electric signal is in the first frequency band, negative feedback current which is generated from the electric signal is injected through said first electrode, and when the frequency of the electric signal is in the second frequency band, the negative feedback current is injected through said first electrode and a current which is anti-phase with the negative feedback current is injected through said second electrode.

65. A driving method according to claim 64, wherein the semiconductor laser has active regions in a region into which current is injected by the first electrode and in a region into which current is injected by the second electrode.

66. A driving apparatus for driving a semiconductor laser which is provided with at least first and second electrodes through each of which current is injected into the semiconductor laser, said driving apparatus comprising:

control means for controlling injection of a current, whose frequency is varied, into said first and second electrodes, wherein said control means controls current injected into said first and second electrodes in accordance with whether the frequency of the current is in a first frequency band or a second frequency band which is lower than the first frequency band, and when the frequency of the current is in the first frequency band, the current is injected through said first electrode, and when the frequency of the current is in the second frequency band, the current is injected through said first electrode and phase-shifted current whose phase is shifted relative to the current is injected through said second electrode.

67. A driving apparatus according to claim 66, wherein the phase-shifted current is anti-phase with the current.

68. A driving apparatus according to claim 66, wherein the second frequency band comprises frequencies less than approximately 10 MHz.

69. A driving apparatus according to claim 66, wherein the current includes at least modulation current modulated according to a predetermined signal.

70. A driving apparatus according to claim 66, wherein the semiconductor laser has active regions in a region into which current is injected by the first electrode and in a region into which current is injected by the second electrode.

* * * * *

UNITED STATES PATENT AND TRADEMARK OFFICE
CERTIFICATE OF CORRECTION

PATENT NO. : 6,055,251
DATED : April 25, 2000
INVENTOR(S) : Toshihiko Ouchi et al.

It is certified that error appears in the above-identified patent and that said Letters Patent is hereby corrected as shown below:

Title page,
Item [56], References Cited, under OTHER PUBLICATIONS

""Multielectrode Distributed Feedback Laser For Pure Frequency Modulation And Chirping Suppressed Amplitude Modulation", Y. Yoshikuni, et al., Journal of Lightwave Technology, vol. LT-5 No. 4, Apr. 1987, pp. 516-522." should be deleted.

Column 2,
Line 26, "and" should be deleted.

Column 6,
Line 4, "provide" should read -- provides --; and
Line 61, "a-schematic" should read -- a schematic --

Column 12,
Line 1, "effect" should read -- effects --; and
Line 33, "an" should read -- a --.

Column 13,
Line 32, "a" should be deleted; and
Line 34, "from the" should read -- from --.

Column 15,
Line 6, "FSk" should read -- FSK --.

Signed and Sealed this

Twenty-seventh of November, 2001

Attest:

NICHOLAS P. GODICI
*Attesting Officer*    *Acting Director of the United States Patent and Trademark Office*